US010916396B2

(12) United States Patent
Shiozaki et al.

(10) Patent No.: US 10,916,396 B2
(45) Date of Patent: Feb. 9, 2021

(54) LOAD CONTROLLER AND LOAD CONTROL METHOD

(71) Applicant: Yazaki Corporation, Tokyo (JP)

(72) Inventors: Tomohiro Shiozaki, Shizuoka (JP); Yoshihide Nakamura, Shizuoka (JP); Satoshi Morita, Shizuoka (JP); Yoshinori Ikuta, Shizuoka (JP); Shuuji Satake, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 199 days.

(21) Appl. No.: 16/039,420

(22) Filed: Jul. 19, 2018

(65) Prior Publication Data

US 2019/0066955 A1    Feb. 28, 2019

(30) Foreign Application Priority Data

Aug. 24, 2017 (JP) ................... 2017-160771
Aug. 24, 2017 (JP) ................... 2017-160772
Aug. 31, 2017 (JP) ................... 2017-167479

(51) Int. Cl.
*H02M 7/493* (2007.01)
*H02M 1/088* (2006.01)
*H02M 7/537* (2006.01)
*H01H 47/00* (2006.01)
*H03K 17/12* (2006.01)
(Continued)

(52) U.S. Cl.
CPC ......... *H01H 47/002* (2013.01); *H03K 17/082* (2013.01); *H03K 17/12* (2013.01); *H03K 2017/0806* (2013.01)

(58) Field of Classification Search
CPC .......... H03K 2017/0806; H03K 17/12; H03K 17/082; H01H 47/002
See application file for complete search history.

(56) References Cited

U.S. PATENT DOCUMENTS

| | | | | |
|---|---|---|---|---|
| 6,023,109 A | * | 2/2000 | Yang | ...................... H02J 7/0024 307/63 |
| 8,766,570 B2 | * | 7/2014 | Geyer | ...................... H02M 1/12 318/400.02 |
| 2006/0164057 A1 | | 7/2006 | Kudo et al. | |

(Continued)

FOREIGN PATENT DOCUMENTS

| | | |
|---|---|---|
| CN | 1812235 A | 8/2006 |
| CN | 102457047 A | 5/2012 |

(Continued)

*Primary Examiner* — Jared Fureman
*Assistant Examiner* — Esayas G Yeshaw
(74) *Attorney, Agent, or Firm* — Kenealy Vaidya LLP

(57) ABSTRACT

A plurality of semiconductor relays is provided between a power source and loads. The semiconductor relays have a function of a current detection for detecting a current passing through themselves. The loads are connected to output terminals respectively. A switching unit arbitrarily selects and switches a connecting destination of the semiconductor relays from among the plurality of output terminals. A microcomputer controls the switching unit on the basis of the detection results of a current flowing through the semiconductor relays, and adjusts the number of the semiconductor relays connected to the same load and connected to each other in parallel.

11 Claims, 17 Drawing Sheets

(51) Int. Cl.
*H03K 17/082* (2006.01)
*H03K 17/08* (2006.01)

(56) References Cited

U.S. PATENT DOCUMENTS

| | | |
|---|---|---|
| 2010/0254059 A1 | 10/2010 | Higuchi et al. |
| 2011/0128065 A1 | 6/2011 | Nishimura |
| 2013/0015704 A1* | 1/2013 | Tsai ............... H02J 9/062 307/23 |
| 2014/0361847 A1* | 12/2014 | Goldblatt ............. H03K 17/007 333/101 |
| 2015/0263558 A1* | 9/2015 | Bae ................. H02J 7/342 307/19 |
| 2017/0085193 A1* | 3/2017 | Akagi ............. H02M 1/42 |
| 2017/0141698 A1* | 5/2017 | Nikolov ............. H02M 1/0845 |

FOREIGN PATENT DOCUMENTS

| | | |
|---|---|---|
| JP | 2001-523610 A | 11/2001 |
| JP | 2009-130944 A | 6/2009 |
| WO | 99/25586 A2 | 5/1999 |
| WO | 2009/148122 A1 | 11/2011 |

* cited by examiner

| POWER CONSUMPTION (W) | WRITING PROGRAM | | | | ... |
| --- | --- | --- | --- | --- | --- |
| | ALL SWITCHES OFF | SWITCH ON/OFF | POWER SAVING CONTROL A | POWER SAVING CONTROL B | ... |
| 0 | ○ | | | | ... |
| 0~80 | | ○ | | | ... |
| 80~100 | | ○ | ○ | | ... |
| 100~130 | | ○ | | ○ | ... |

LOAD CONTROLLER AND LOAD CONTROL METHOD

CROSS REFERENCE TO RELATED APPLICATION

The priority applications Japanese Patent Application No. 2017-160771, 2017-160772 and 2017-167479 upon which this patent application is based are hereby incorporated by reference.

FIELD OF THE INVENTION

The present invention relates to a load controller and a load control method.

BACKGROUND OF THE INVENTION

Conventionally, as a load controller described above, for example, a load driving device described in WO 2009/148122 A has been proposed. In this load driving device, one semiconductor relay is directly connected to one load to control power source to the load.

However, in the conventional load driving device, when the load current increases due to change or addition of the load equipment, the semiconductor relay also needs a capacity for a large current. Therefore, there is a first problem that the entire load driving device needs to be replaced.

In addition, as a control system, for example, the current distribution system described in JP 2001-523610 A has been proposed. The current distribution system described above has a socket that controls a switch that distributes power source to an actuator. All basic programs necessary for a plurality of sockets are stored in the socket. In addition, identification numbers are provided in the plurality of sockets, and the socket is configured to select and execute only a basic program corresponding to the identification number out of all the basic programs.

In the current distribution system of JP 2001-523610 A described above, identification information needs to be set in the socket in order to allow the socket to select a necessary program among all the basic programs. Therefore, there is a problem that work of setting identification information in the socket needs to be done in advance, which is troublesome.

Conventionally, as a load controller described above, for example, a power source protective device described in JP 2009-130994 A has been proposed. When the current flowing through the semiconductor switch element that turns on and off the power to a load or the temperature of the harness calculated from the current exceeds an upper limit value, the power source protective device turns off the semiconductor switch in which the upper limit value has been exceeded. Semiconductor switches in which the upper limit value is not exceeded are not turned off.

Meanwhile, it is considered to reduce the current flowing to each switch by simultaneously turning on and off a plurality of parallel switches connected in parallel so as to drive the same load. In the case where the power source protective device described above is applied to such a plurality of parallel switches, the following problem arises.

Since a plurality of parallel switches is designed to allow the same current to flow, if an abnormality such as overcurrent, overheating or the like occurs, all of the parallel switches should be turned off at the same time by the power source protective device. However, in reality, it has been found that since the flowing current is slightly different due to variations in the on-resistance and the pattern resistance and the like in a plurality of parallel switches, when abnormality such as overcurrent, overheating, etc. occurs, the plurality of parallel switches are not turned off simultaneously and are cut off at slightly deviated timing.

To be specific, among a plurality of parallel switches, a switch through which a high current flows is first turned off due to excess of the current over the upper limit value. Then the current headed for the first turned-off parallel switch is additionally applied to the remaining parallel switch that is still on. Therefore, the remaining parallel switch is also turned off due to the excess over the upper limit value. However, since a current including the additional current caused from the previously turned-off parallel switch flows in the subsequently turned-off parallel switch, abnormal heat generation and resistance deterioration cannot be suppressed sufficiently.

SUMMARY OF THE INVENTION

The present invention has been made in view of the above background, and a first object of the present invention is to provide a load controller and a load control method which do not require replacement in response to a change in load.

It is a second object of the present invention to provide a control system and a writing device which can easily select a program.

The present invention has been made in view of the above background, a third object of the present invention is to provide a load controller and a load control method capable of suppressing abnormal heat generation and resistance degradation.

A load controller according to an aspect of the present invention includes a plurality of switches provided between a power source and a load; a current detection unit configured to detect a current flowing through each of the plurality of switches; and a first adjustment unit configured to adjust number of the switches connected in series to a same load and connected in parallel to each other, based on a detection result of the current detection unit.

In addition, the load controller may further include a plurality of output terminals to which loads are respectively connected; and a switching section configured to switch by arbitrarily selecting a connecting destination of the plurality of switches from among the plurality of output terminals (i.e., select to which output terminals the switches are connected to), wherein the first adjustment unit may control the switching section to adjust the number of the switches.

In addition, the load controller may further include a PWM control unit configured to start a PWM control of the plurality of switches when the current flowing through each of the plurality of switches or sum of currents flowing through the plurality of switches exceeds a threshold value.

In addition, the PWM control unit may output pulses having a same duty to the plurality of parallel-connected switches connected in series to the same load and connected in parallel to each other among the plurality of switches so as to control on/off of the plurality of parallel-connected switches, and the load controller may further include a second adjustment unit configured to shift a phase of the pulses to be output to the plurality of parallel-connected switches such that the currents are constant when the plurality of parallel-connected switches are on.

Furthermore, the load controller may further include: a PWM control unit configured to output pulses having a same duty to the plurality of parallel-connected switches connected in series to the same load and connected in parallel to each other among the plurality of switches so as to control on/off of the plurality of parallel-connected switches; and a second adjustment unit configured to shift a phase of the pulses to be output to the plurality of parallel-connected switches such that the currents are constant when the plurality of parallel-connected switches are on.

A method for controlling a load according to an aspect of the present invention includes detecting a current flowing through each of a plurality of switches provided between a power source and a load; and adjusting number of the switches connected in series to a same load and connected in parallel to each other according to a detection result.

A control system according to an aspect of the present invention includes a load control unit that controls power source to a load, and an execution unit that causes the load control unit to execute only a program corresponding to the load control unit among a plurality of programs, and the load control unit detects a current flowing in the load, and the execution unit selects a program corresponding to a current value detected by the load control unit or corresponding to a value related to the current value out of the plurality of programs and causes the load control unit to execute the program.

Further, the load control unit may detect a voltage applied to the load, and the execution unit may select a program corresponding to the power consumption obtained from the detected current value and voltage value.

The execution unit may include a writing device that writes a program in the load control unit, and the writing device may write the selected program to the load control unit.

Further, the load control unit may be connected to a wire harness having a connector attached to its one end, and the writing device may be connected to the connector.

Further, a writing device according to an aspect of the present invention and for writing a program in a load control unit that controls power source to a load is characterized by having a receiving unit that receives a current value of the current flowing in the load control unit, and a writing unit that selects a program corresponding to the received current value or corresponding to the value related to the received current value among the plurality of programs and writes the selected program in the load control unit.

A load controller according to an aspect of the present invention is characterized by having a plurality of parallel switches connected in series to the same load and connected in parallel to each other and turning on and off power supply to the same load, an abnormality detection unit that detects abnormality of each of the plurality of parallel switches, and a control unit that turns off all of the plurality of parallel switches when an abnormality is detected in any one of the plurality of parallel switches.

In addition, the abnormality detection unit may detect the abnormality if even one of the temperature of the parallel switch, the current flowing through the parallel switch, and the power supplied to the parallel switch is equal to or higher than a threshold value.

A load control method according to an aspect of the present invention is characterized by having steps of detecting an abnormality in each of a plurality of parallel switches connected in series to the same load and connected in parallel to each other and turning on and off power supply to the same load, and turning off all of the plurality of parallel switches when an abnormality is detected in any one of the plurality of parallel switches.

According to the above aspect, even when the load has been changed to a load with a large load current, the number of switches connected in parallel can be increased to cope with the change. Therefore, it is unnecessary to change the switch to one allowing a high current, so that no replacement is necessary.

Further, according to the above aspect, since an operation of setting an identification number in advance in the load control unit is unnecessary, a program can be easily selected.

According to the above aspect, when an abnormality is detected in any one of the plurality of parallel switches, all of the plurality of parallel switches are turned off, so that abnormal heat generation and deterioration in resistance can be suppressed.

DETAILED DESCRIPTION OF EXEMPLARY EMBODIMENT OF THE INVENTION

First Embodiment

Figure 1:
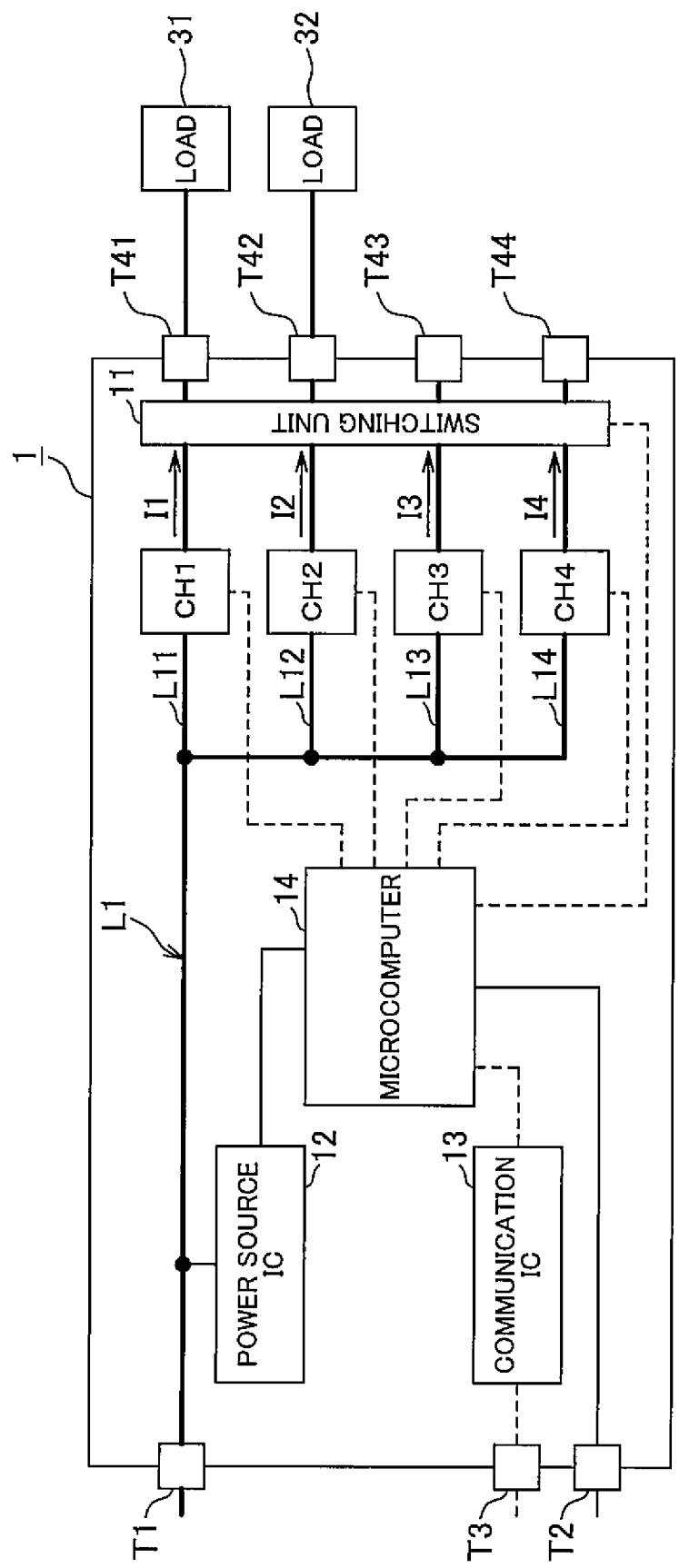
FIG. 1 is a diagram showing a first embodiment of a load controller of the present invention.

Hereinafter, a first embodiment of the present invention will be described with reference to FIG. 1. FIG. 1 is a diagram showing the first embodiment of the load controller according to the present invention. A load controller 1 of the present invention is a device that controls power supply to a load such as a lamp mounted on a vehicle, namely a passenger car for example.

As shown in FIG. 1, the load controller 1 is provided with a power source terminal T1, a ground terminal T2, a communication terminal T3 and a plurality of output terminals T41 to T44 which are constituted by terminal fittings. Further, the load controller 1 includes semiconductor relays CH1 to CH4 as a plurality of switches, a switching unit 11 as the switching section, a power source IC 12, a communication IC 13, a microcomputer 14. Hereinafter, the semiconductor relays CH1 to CH4 may be simply referred to as semiconductor relays CH.

In the present embodiment, an example in which the four semiconductor relays CH1 to CH4 are built in the load controller 1 will be described, but the present invention is not limited to this. The number of the semiconductor relays CH may be two or more.

The power source terminal T1 is a terminal to which power is supplied. The ground terminal T2 is a terminal to which a ground is supplied. The communication terminal T3 is a terminal through which a communication signal is input/output. The plurality of output terminals T41 to T44 are connected to loads 31 and 32 (hereinafter also simply referred to as "loads 3") and are terminals for power output. The power source terminal T1 and the plurality of output terminals T41 to T44 are connected by a power source line L1. The power source line L1 has a plurality of branches on the output terminal T41 to T44 side.

The plurality of semiconductor relays CH1 to CH4 are respectively provided on branch lines L11 to L14 branched from the power source line L1. When the semiconductor relays CH1 to CH4 are turned on, power is output from the connected output terminals T41 to T44 and is supplied to the loads 31 and 32 connected to the output terminals T41 to T44.

When the semiconductor relays CH1 to CH4 are turned off, the power from the connected output terminals T41 to T44 is cut off, and thus the power supply to the loads 31 and 32 connected to the output terminals T41 to T44 is cut off. In addition, each of the semiconductor relays CH1 to CH4 has a function as a current detection unit. The semiconductor relays CH1 to CH4 detect currents flowing in themselves and output the detected currents to the microcomputer 14.

The switching unit 11 is provided between the plurality of semiconductor relays CH1 to CH4 and the plurality of output terminals T41 to T44. The switching unit 11 is composed of a switch (not shown), and a connecting destination of the plurality of semiconductor relays CH1 to CH4 can be arbitrarily selected and switched from among the plurality of output terminals T41 to T44.

The power source IC 12 converts the power supply input from the power source terminal T1 and the ground terminal T2 into the operation power supply of the microcomputer 14 and supplies the converted power supply to the microcomputer 14.

The communication IC 13 is an IC for communicating with a device (master ECU, another load controller, writing device, etc.) having another communication function provided outside the load controller 1.

The microcomputer 14 is configured to include a central processing unit (CPU) having memories such as a random access memory (RAM) and a read only memory (ROM), and controls the entire load controller 1.

The microcomputer 14 is connected to each of the semiconductor relays CH1 to CH4 and controls the power supply to a load 3 owing to communication with the master ECU and by turning on and off the semiconductor relays CH1 to CH4. Further, the microcomputer 14 is connected to the switching unit 11, and controls the switching unit 11 based on currents flowing through the semiconductor relays CH1 to CH4.

Figure 2:
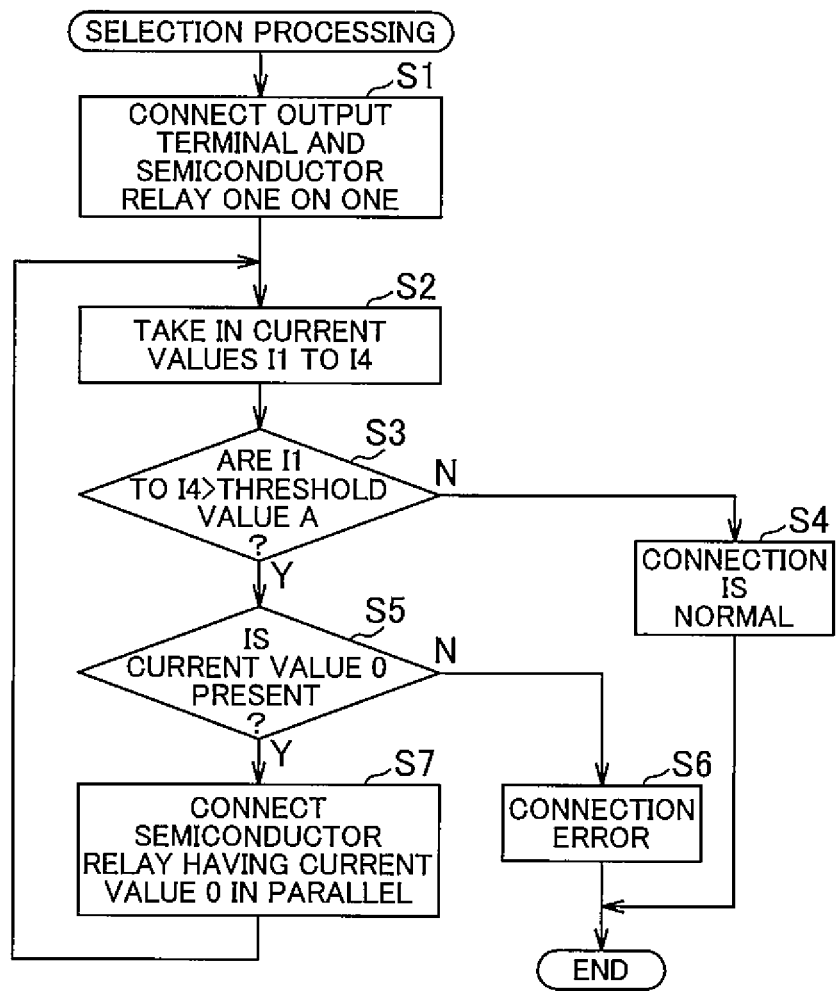
FIG. 2 is a flowchart showing a selection processing procedure of a microcomputer shown in FIG. 2.

Next, the operation of the load controller 1 having the above-described configuration will be described below with reference to the flowchart of FIG. 2. FIG. 2 is a flowchart showing a selection processing procedure of the microcomputer 14 that selects the connecting destination of the semiconductor relays CH1 to CH4 from among the plurality of output terminals T41 to T44. By executing this selection processing, the microcomputer 14 functions as a first adjustment unit.

Figure 3:
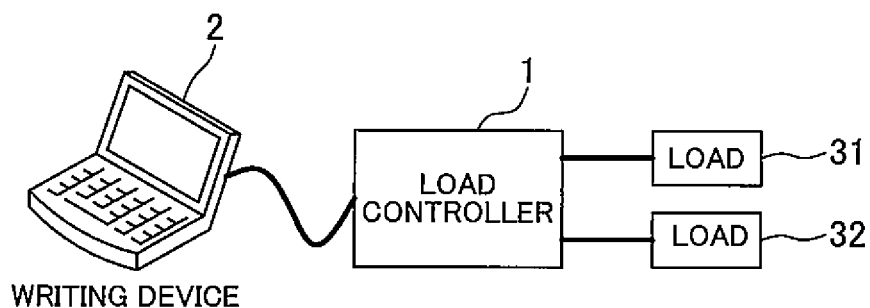
FIG. 3 is a diagram in which a writing device is connected to the load controller shown in FIG. 1.

For example, when a writing device 2 is connected to the communication terminal T3 of the load controller 1 as shown in FIG. 3, the microcomputer 14 executes selection processing shown in FIG. 2. First, the user implements change (including addition) of the loads 31 and 32 connected to the load controller 1, and then connects the writing device 2 to the load controller 1. This is done for the purpose of writing a control program for the changed loads 31 and 32 in the load controller 1.

Figure 4:
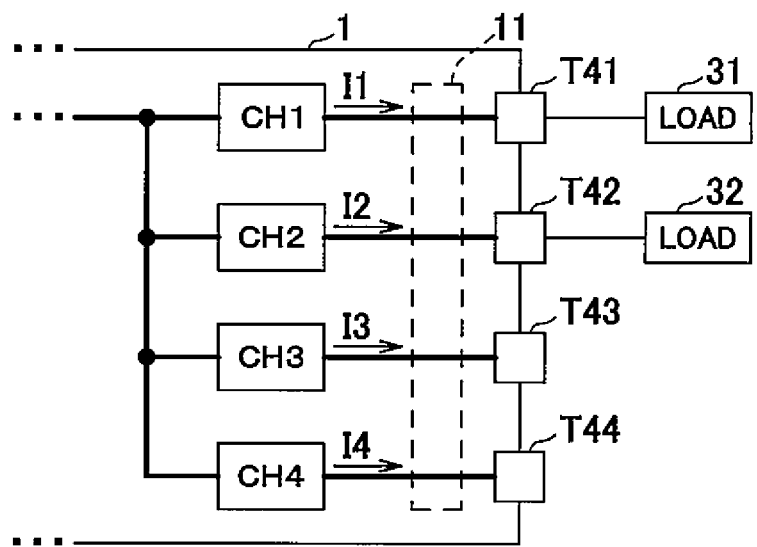
FIG. 4 is an explanatory diagram for describing an operation in the selection processing of the microcomputer shown in FIG. 1.

In the selection processing, the microcomputer 14 controls the switching unit 11 to connect the output terminals T41 to T44 and the semiconductor relays CH1 to CH4 on a one to one basis (step S1) as shown in FIG. 4. Next, the microcomputer 14 takes in currents I1 to I4 detected by the respective semiconductor relays CH1 to CH4 (step S2) and determines whether any one current exceeding a threshold value A among the current I1 to I4 is present (step S3).

When none of the currents I1 to I4 exceeding the threshold value A is present (N in step S3), the microcomputer 14 transmits a message to the writing device 2 that the connection has been normally performed (step S4), and terminates the processing. Upon receiving the message that the connection has been performed normally, the writing device 2 transmits the control program of the connected load 3 to the load controller 1. The load controller 1 writes the transmitted control program in a memory such as a ROM.

On the other hand, when any one of the currents I1 to I4 exceeding the threshold value A is present (Y in step S3), the microcomputer 14 determines whether there is a current value 0 among the currents I1 to I4 (step S5). When there is no current value 0 (N in step S5), the microcomputer 14 determines that there is no semiconductor relay CH to which the load 3 is not connected, and transmits information on a connection error of the load 3 to the writing device 2 (step S6), then ending the processing.

When there is a current value 0 (Y in step S5), the microcomputer 14 controls the switching unit 11 so that one of the semiconductor relays CH having no current flow is connected to the output terminals T41 to T44 connected with the semiconductor relay CH through which a current exceeding the threshold value A flows (step S7), and returns the processing to step S2.

Figure 5:
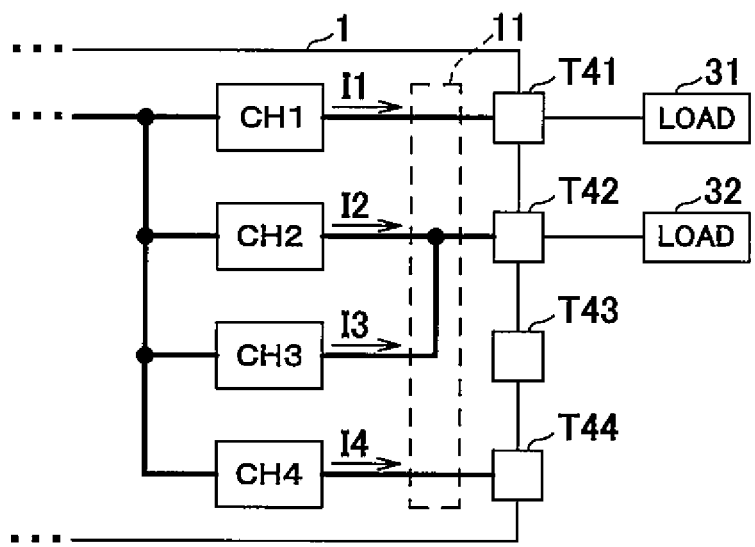
FIG. 5 is an explanatory diagram for describing the operation in the selection processing of the microcomputer shown in FIG. 1.

According to the above operation, when neither the current I1 nor I2 exceeds the threshold value A in the state shown in FIG. 4, the microcomputer 14 transmits a message to the writing device 2 that the connection is normal in the state shown in FIG. 4. On the other hand, a case where the current I2 exceeds the threshold value A, for example, in the state shown in FIG. 4 will be considered. In this case, as shown in FIG. 5, the microcomputer 14 connects the semiconductor relay CH3 to the output terminal T42 so as to connect the semiconductor relay CH3 to the semiconductor relay CH2 in parallel (step S7). The semiconductor relay CH3 is one of the semiconductor relays CH in which no current was flowing (no load was connected). As a result, the current flowing through the load 32 branches to the semiconductor relays CH2 and CH3, so that the current I2 decreases.

As a result, when none of the currents I1 to I4 exceeds the threshold value A, the microcomputer 14 transmits a message that the connection is normal to the writing device 2 in the state shown in FIG. 5. On the other hand, when the current I2 or I3 exceeds the threshold value A even if the semiconductor relays CH2 and CH3 are connected in parallel in step S7, (Y in step S3), the microcomputer 14 connects the semiconductor relay CH4 to the output terminal T42 and connect the relay in parallel to the semiconductor relays CH2 and CH3 as shown in FIG. 6 (step S7).

Figure 6:
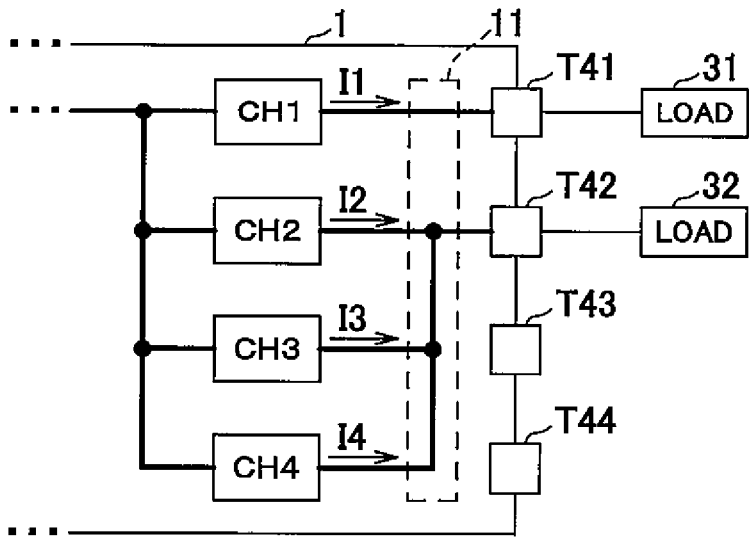
FIG. 6 is an explanatory diagram for describing the operation in the selection processing of the microcomputer shown in FIG. 1.

As a result, if none of the currents I1 to I4 exceeds the threshold value A, the microcomputer 14 transmits a message that the connection is normal to the writing device 2 in the state shown in FIG. 6.

Due to the above-described operation, the microcomputer 14 can adjust the number of semiconductor relays CH1 to CH4 connected to the same load 32 in series and connected to each other in parallel, in accordance with the detection results of the semiconductor relays CH1 to CH4 as shown in FIGS. 4 to 6. Thereby, for example, even if the load 32 is changed to one having a large load current, the number of semiconductor relays CH1 to CH4 connected in parallel is increased by utilizing the semiconductor relays CH3 and CH4 to which the load 32 is not connected so that the microcomputer 14 can cope with the situation. Therefore, it is unnecessary to change the semiconductor relays CH1 to CH4 (i.e., the load controller 1) themselves to those allowing a high current.

Further, according to the above-described embodiment, the switching unit 11 can arbitrarily select the connecting destinations of the plurality of semiconductor relays CH1 to CH4 for switching from among the plurality of output terminals T41 to T44. Then, the microcomputer 14 controls the switching unit 11 to adjust the number of semiconductor relays CH1 to CH4 connected in parallel. Thereby, the number of semiconductor relays CH1 to CH4 connected in parallel can be adjusted with a simple configuration.

Next, the first overcurrent suppression processing and the second overcurrent suppression processing of the above-described load controller 1 will be described with reference to FIGS. 7 to 10. When writing of the control program of the load controller 1 by the writing device 2 is completed, the user connects the master ECU mounted on the vehicle to the communication terminal T3. The microcomputer 14 operates according to the written control program and turns on and off the semiconductor relays CH1 to CH4 according to an on/off command from the master ECU. In the normal state, the microcomputer 14 always keeps the semiconductor relays CH1 to CH4 on when receiving the on-command.

In addition, the microcomputer 14 executes the first overcurrent suppression processing and the second overcurrent suppression processing in parallel. When the currents I1 to I4 or the sum of the currents I1 to I4 exceeds a threshold value, the microcomputer 14 functions as a PWM control unit, and switches from the always-on state of the semiconductor relays CH1 to CH4 to the PWM control that outputs pulses with a constant cycle according to the on-command.

Details of the first overcurrent suppression processing will be described with reference to FIGS. 7 and 8. The semiconductor relays CH1 to CH3 are now assumed to be connected to the same load 3 (the same output terminal among T41 to T44) and to be connected in parallel with each other. Further, it is assumed that another semiconductor relay is not connected to the semiconductor relay CH4 in parallel.

Figure 7:
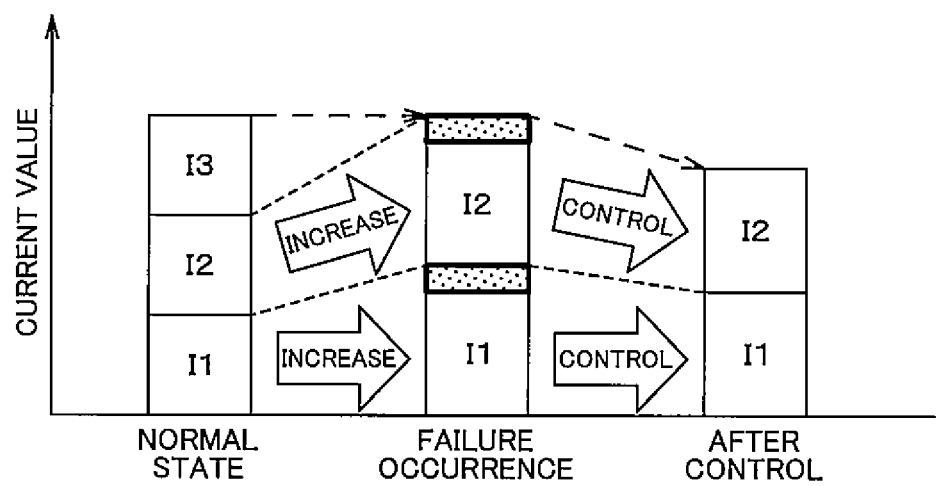
FIG. 7 is a time chart of currents when a semiconductor relay fails.
Figure 8:
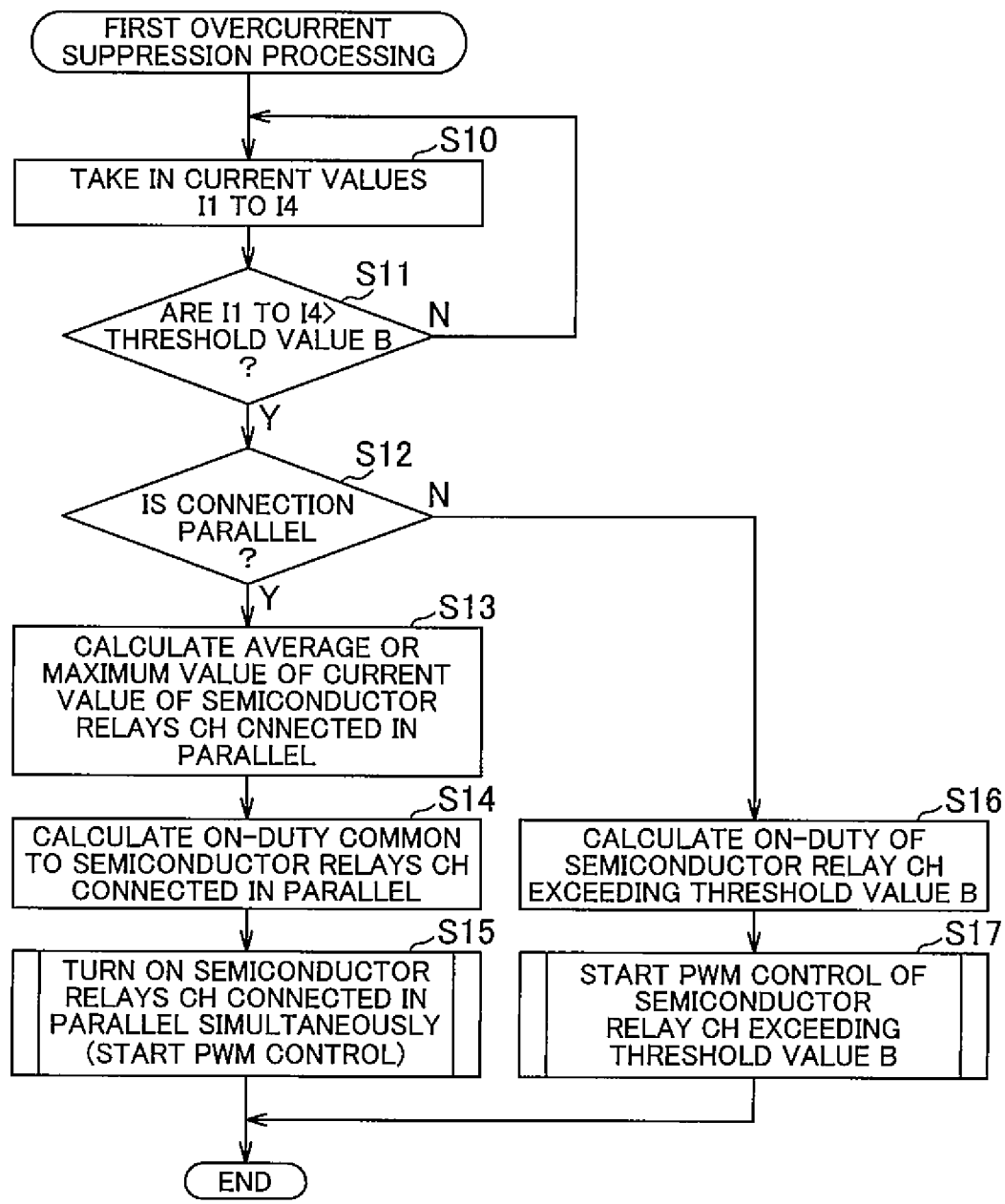
FIG. 8 is a flowchart showing a first overcurrent suppression processing of the microcomputer shown in FIG. 1.

At this time, if one of the semiconductor relays CH1 to CH3 (for example, the semiconductor relay CH3) breaks down, the current I3 flowing through the semiconductor relay CH3 becomes 0, and the currents I1 and I2 flowing through the unbroken semiconductor relays CH1 and CH2 increase as shown in FIG. 7.

In the first overcurrent suppression processing, the microcomputer 14 takes in the currents I1 to I4 detected by the respective semiconductor relays CH1 to CH4 (step S10) and determines whether any one of the currents I1 to I4 exceeding a threshold value B is present (step S11). While none of the currents I1 to I4 exceeds the threshold value B (N in step S11), the microcomputer 14 returns to step S10 and the always-on control is continued.

On the other hand, if any one of the currents I1 to I4 exceeding the threshold value B is present (Y in step S11), the microcomputer 14 determines whether the semiconductor relays CH1 to CH4 through which the currents I1 to I4 exceeding the threshold value B flows are the parallel-connected semiconductor relays (step S12). Here, the "parallel-connected semiconductor relays" refers to ones constituting a plurality of semiconductor relays connected to the same load 3 and connected in parallel with each other. As shown in FIG. 7, when the semiconductor relay CH3 breaks down, the currents I2 and I3 flowing through the semiconductor relays CH1 and CH2 exceed the threshold value B. Since the semiconductor relays CH2 and CH3 are connected in parallel, the microcomputer 14 determines that the relays are parallel-connected semiconductor relays in step S12 (Y in step S12).

Thereafter, the microcomputer 14 calculates the average value or the maximum value of the currents I1 to I3 of the parallel-connected semiconductor relays CH1 to CH3 (step S13). Next, on the basis of the average value or the maximum value of the currents I1 to I3 calculated in step S13, the microcomputer 14 calculates the on-duty of the semiconductor relays CH1 to CH3 so that the currents I1 to I3 will be equal to or less than the threshold value B (step S14). Thereafter, the microcomputer 14 starts the PWM control to turn on/off the parallel-connected semiconductor relays CH1 to CH3 with the duty calculated in step S14 (step S15), and ends the processing.

On the other hand, when the current I4 exceeds the threshold value B, the microcomputer 14 determines that the relays are not parallel-connected semiconductor relays in step S12 (N in step S12). Thereafter, the microcomputer 14 calculates the on-duty of the semiconductor relay CH4 so that the current I4 is equal to or less than the threshold value B (step S16). Thereafter, the microcomputer 14 starts PWM control for turning on and off the semiconductor relay CH4 with the duty calculated in step S16 (step S17), and ends the processing.

According to the above-described first overcurrent suppression processing, even when the currents I1 and I2 increase due to failure of the semiconductor relay CH3, the semiconductor relays CH1 and CH2 are switched from the always-on state to the PWM control state, the currents I1 and I2 decrease and the threshold value B is not exceeded, as shown in FIG. 7. This can inhibits overcurrent from flowing through the semiconductor relays CH1 to CH4.

Next, the second overcurrent suppression processing will be described with reference to FIGS. 9 and 10. It is now assumed that the semiconductor relays CH1 to CH3 are connected to the same load 3 (the same output terminal among T91 to T44) and are connected in parallel with each other. Further, it is assumed that the load 3 is not connected to the semiconductor relay CH9. When the power source voltage rises as shown in FIG. 9, the currents I1 to I9 flowing through the semiconductor relays CH1 to CH3 increase, respectively.

In the second overcurrent suppression processing, the microcomputer 19 takes in the currents I1 to I4 detected by the respective semiconductor relays CH1 to CH4 (step S20) and then calculates the sum of the currents I1 to I4 (step S21). When the calculated sum is equal to or less than a threshold value C (N in step S22), the microcomputer 19 returns to step S20 again.

On the other hand, when the sum exceeds the threshold value C (Y in step S22), the microcomputer 14 calculates the on-duty of all the semiconductor relays CH1 to CH4 in which the sum will not exceed the threshold value C (step S23). Thereafter, the microcomputer 14 starts the PWM control for turning on and off all the semiconductor relays CH1 to CH4 with the duty calculated in step S23 (step S24), and ends the processing.

Figure 9:
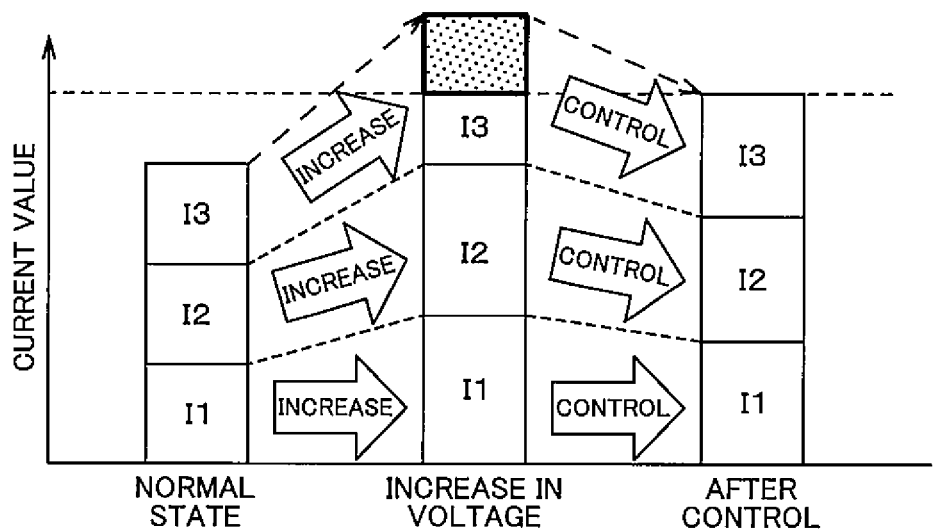
FIG. 9 is a time chart of the currents when the power source voltage increases.
Figure 10:
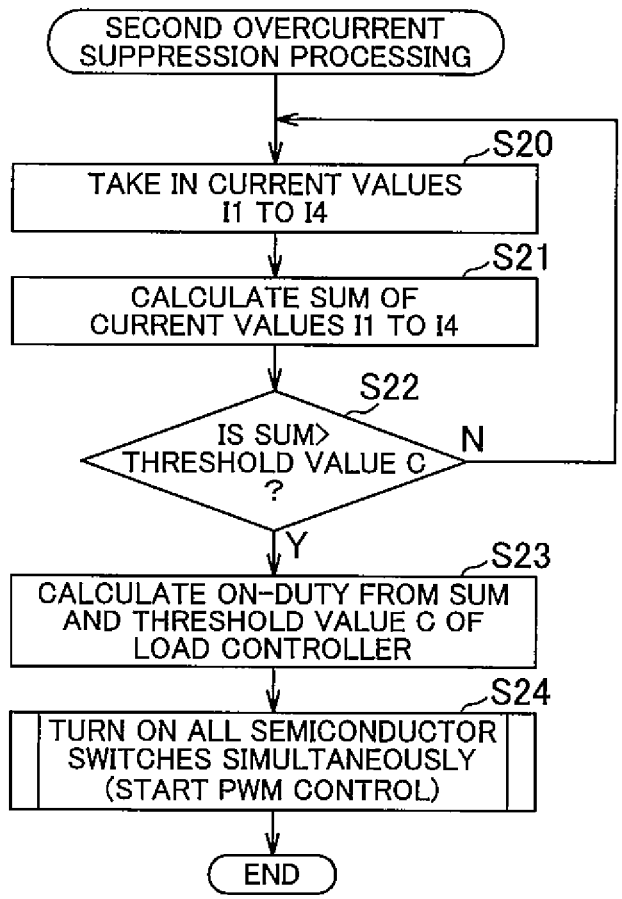
FIG. 10 is a flowchart showing a second overcurrent suppression processing of the microcomputer shown in FIG. 1.

According to the above second overcurrent suppression processing, even if the power source voltage rises and the currents I1 to I4 flowing through all the semiconductor relays CH1 to CH4 increase, the semiconductor relays CH1 to CH4 are switched from always-on state to PWM control state, and the currents I1 to I4 decrease, so that the sum does not exceed the threshold value C as shown in FIG. 9. This can inhibit overcurrent from flowing through the semiconductor relays CH1 to CH4.

Incidentally, in the case of performing the above-described PWM control, the microcomputer 14 simultaneously outputs pulses of the same duty to the semiconductor relays CH connected to the same load 3 and connected in parallel to turn the relays on and off.

Figure 11:
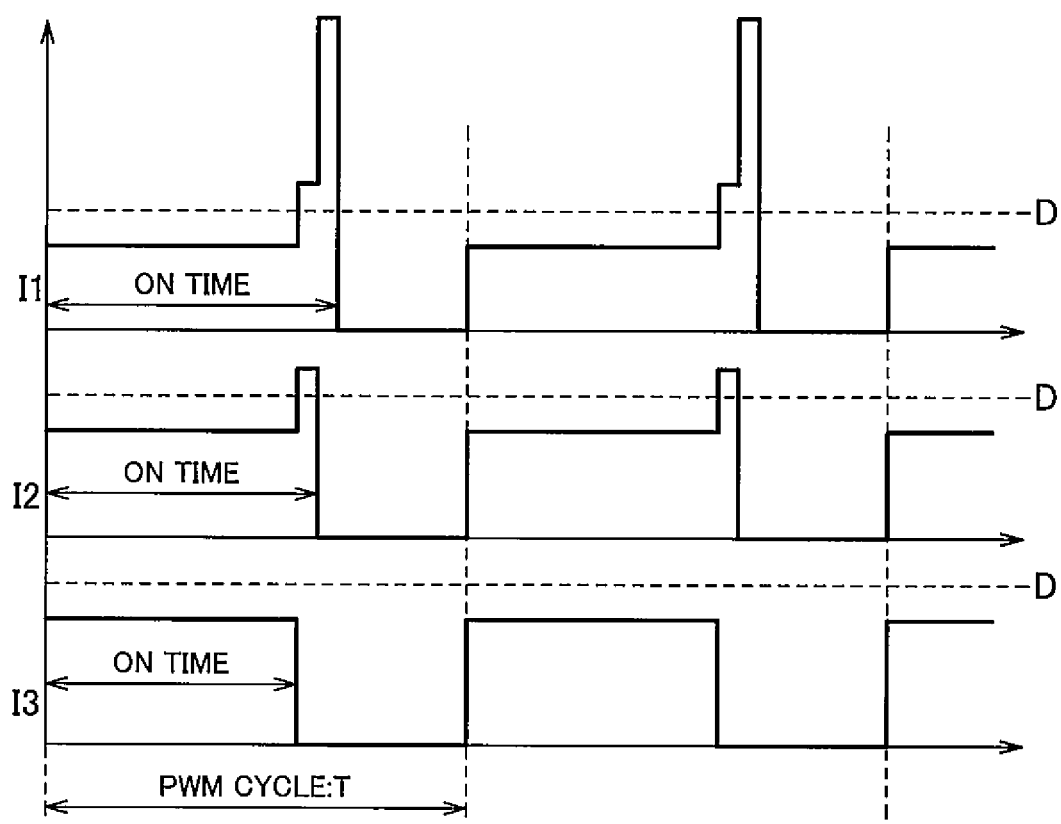
FIG. 11 is a time chart of the currents when the off-timings of semiconductor relays are deviated.
Figure 12:
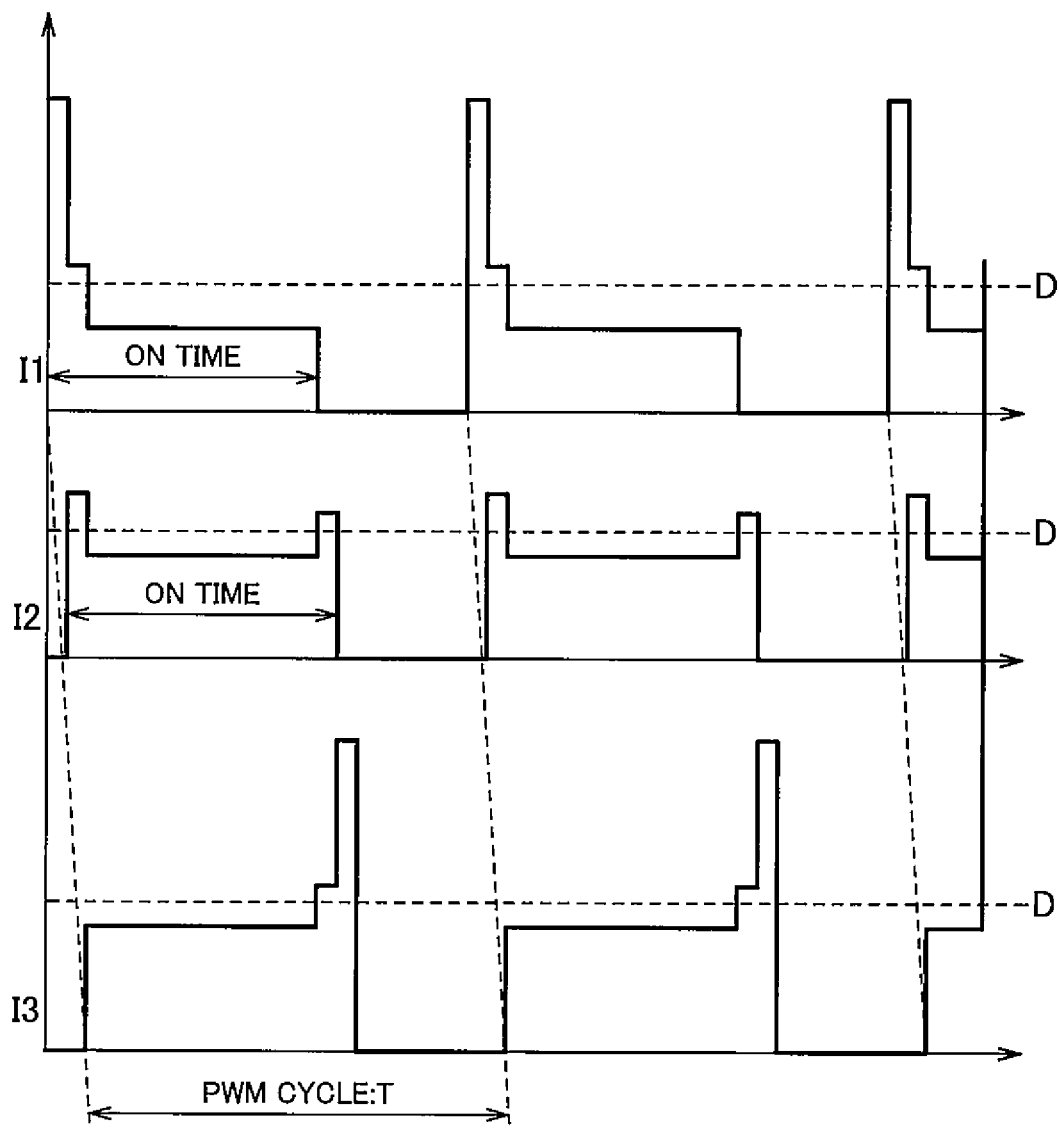
FIG. 12 is a time chart of the currents when on/off timings of the semiconductor relays are deviated.

However, even if, for example, the same on/off signal is output to the plurality of semiconductor relays CH1 to CH3 for simultaneous on/off control, the semiconductor relays CH1 to CH3 cannot be turned on and off at the same time due to their different characteristics. For example, as shown in FIG. 11, the timing for the turning-off may be delayed in the order of the semiconductor relays CH3, CH2, and CH1. In this case, a large current is allowed to flow through the semiconductor relay CH1 that has been turned off last at every cycle of the PWM control. Also, as shown in FIG. 12, the timing for turning-on may be delayed in the order of the semiconductor relays CH1, CH2, and CH3. In this case, a large current is allowed to flow also through the semiconductor relay CH1 which is turned on first at every cycle of the PWM control.

Therefore, in the present embodiment, when executing the PWM control, the microcomputer 14 functions as a second adjustment unit, and deviates the phases of the on/off signals output to the parallel-connected semiconductor relays CH1 to CH3 from each other, thereby enabling the semiconductor relays CH1 to CH3 to be turned on and off at the same time.

To be specific, the microcomputer 14 detects currents flowing through the semiconductor relays CH1 to CH3. In the case shown in FIG. 12, the microcomputer 14 delays the on-signals to the semiconductor relays CH1 and CH2 through which the currents I1 and I2 exceeding a threshold value D flow at the timing of on by a predetermined phase for example, with respect to an on-signal to the semiconductor relay CH3 through which the current I3 equal to or less than the threshold value D flows. The microcomputer 14 repeatedly performs this operation until the currents I1 to I3 at the on-timing become equal to or less than the threshold value D.

Figure 13:
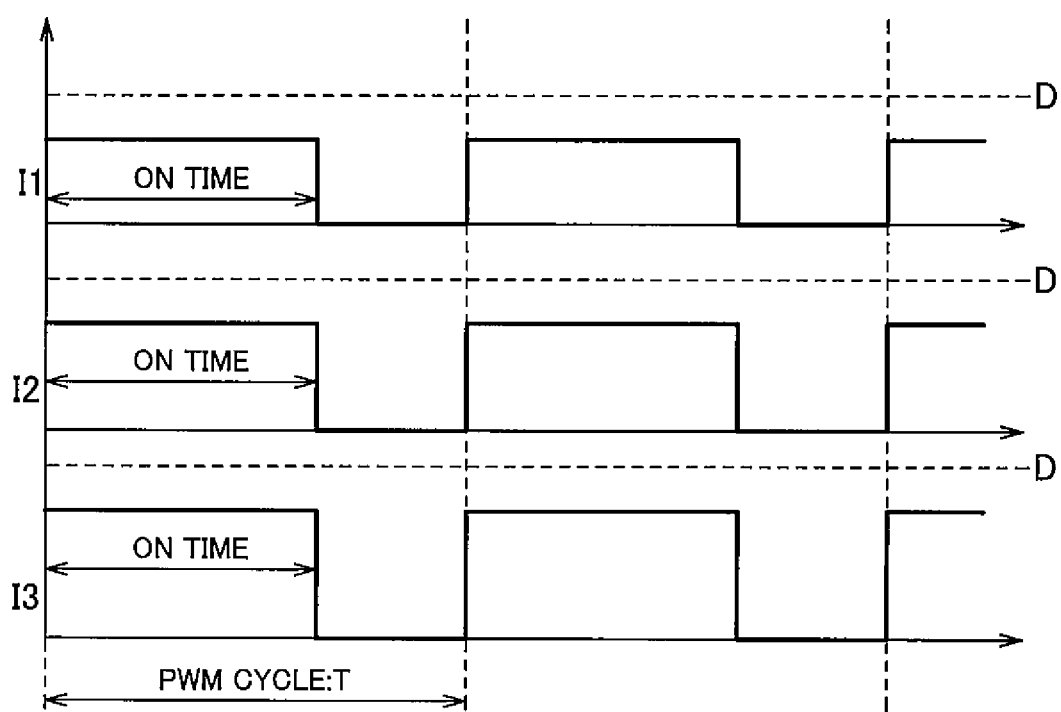
FIG. 13 is a time chart of the currents when on/off timings of the semiconductor relays accord with each other.

In the case shown in FIG. 11, the microcomputer 14 advances, the off-signals to the semiconductor relays CH1 and CH2 through which the currents I1 and I2 exceeding the threshold value D flow at the timing of off by a predetermined phase with respect to the off-signal to the semiconductor relay CH3 through which the current I3 equal to or less than the threshold value D flows. The microcomputer 14 repeatedly performs this operation until the currents I1 to I3 at the off-timing all become equal to or less than the threshold value. By shifting the output timing of the on-signals and the off-signals in this way, the microcomputer 14 can turn on and off the semiconductor relays CH1 to CH3 at the same time as shown in FIG. 13.

According to the embodiment described above, the microcomputer 14 shifts the phases of the pulses output to the parallel-connected semiconductor relays CH1 to CH3 so that the currents I1 to I3 when the parallel-connected semiconductor relays CH1 to CH3 are on become constant. This can suppress the overcurrent caused by the on/off time lag of the semiconductor relays CH1 to CH3.

According to the above-described embodiment, when the currents I1 to I4 flowing through the semiconductor relays CH1 to CH4 exceed the threshold value B or the sum of the currents I1 to I4 exceeds the threshold value C, the microcomputer 14 switches from the always-on state to PWM control state, but the manner is not limited to this. The microcomputer 14 may always perform PWM control so as to reset the duty when the currents I1 to I4 flowing through the semiconductor relays CH1 to CH4 exceed the threshold value B or the sum of the currents I1 to I4 exceeds the threshold value C.

Further, according to the above-described embodiment, the semiconductor relays CH1 to CH4 are provided with the current detection function, but the manner is not limited thereto. A current detection unit for detecting the currents I1 to I4 may be provided separately from the semiconductor relays CH1 to CH4.

Further, according to the above-described embodiment, the number of the semiconductor relays CH1 to CH4 is equal to the number of the output terminals T41 to T44, but the number is not limited thereto. The number of the semiconductor relays CH1 to CH4 may be larger than the number of the output terminals T41 to T44.

Second Embodiment

Figure 14:
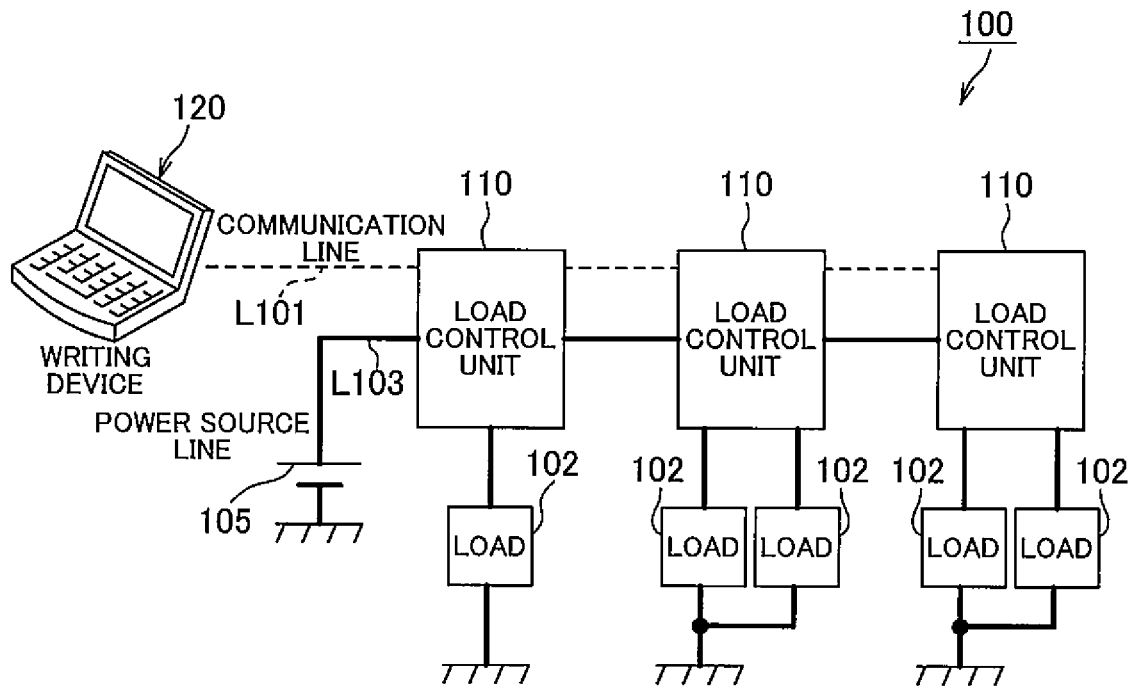
FIG. 14 is a diagram showing a second embodiment of a writing system as a control system of the present invention.
Figure 15:
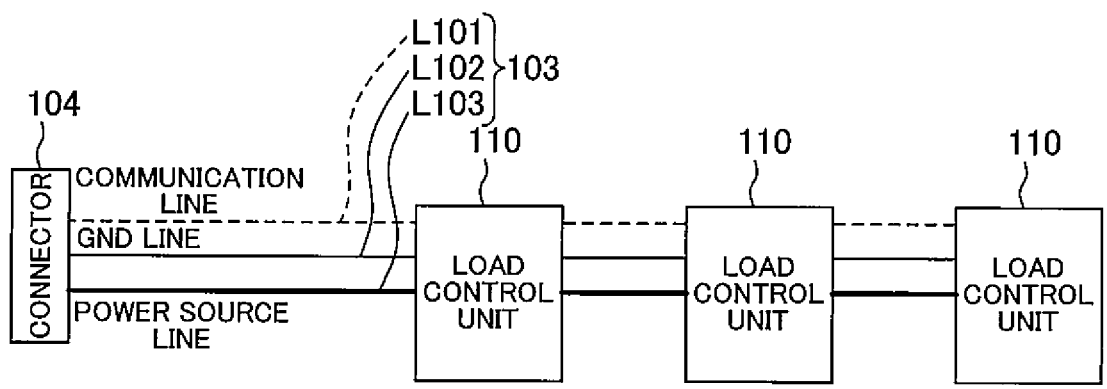
FIG. 15 is a diagram showing a state in which the load control unit shown in FIG. 14 is attached to a wire harness.
Figure 16:
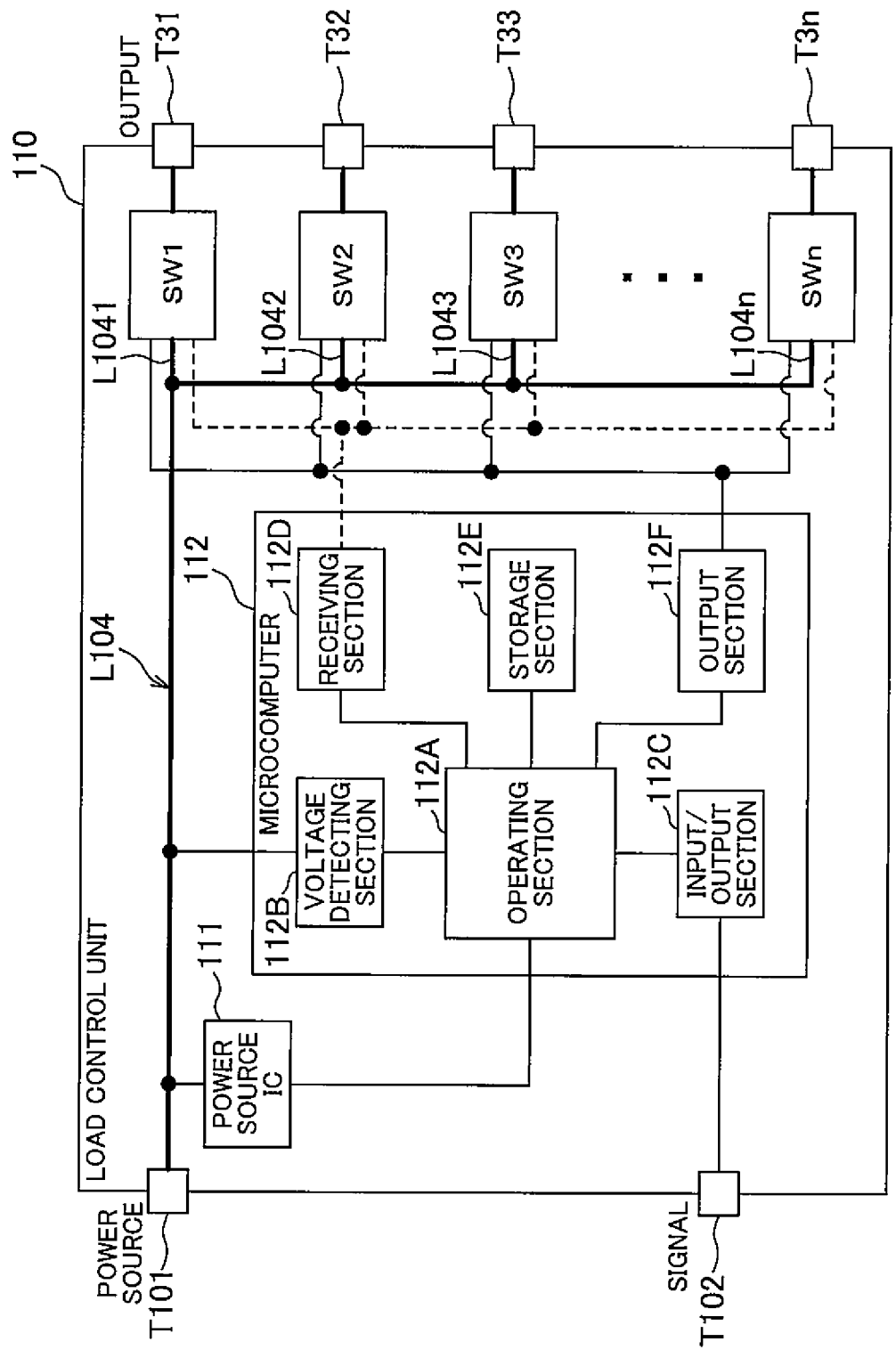
FIG. 16 is a block diagram showing a configuration of a load control unit shown in FIG. 14.
Figures 24, 25:
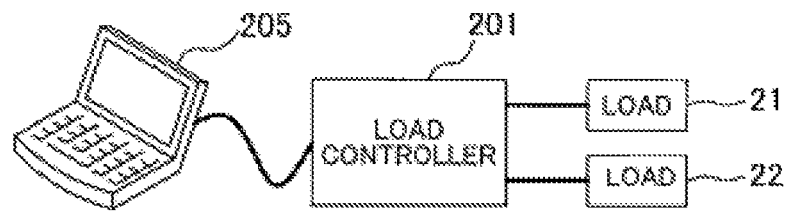
FIG. 24 is a diagram showing a state in which a writing device is connected to the load controller shown in FIG. 18.
FIG. 25 is an exemplary reference table for the writing system of FIG. 14.

Hereinafter, a second embodiment of the present invention will be described with reference to FIGS. 14 to 16 and 25. FIG. 14 is a diagram showing an embodiment of a writing system as a control system of the present invention. FIG. 15 is a diagram showing a state in which the load control unit shown in FIG. 14 is attached to the wire harness. FIG. 16 is a block diagram showing the configuration of the load control unit shown in FIG. 14. FIG. 25 shows an exemplary reference table for the writing system.

As shown in FIG. 14, a writing system 100 of the present invention is a system for writing a program in a load control unit 110 that controls a load 102 mounted on a vehicle such as a passenger car. The writing system 100 includes a plurality of load control units 110 and a writing device 120 (=execution unit) for writing programs in these load control units 110.

As shown in FIG. 15, the plurality of load control units 110 are connected by bus-connection using a wire harness 103 composed of a communication line L101, ground line L102 and power source line L103. The plurality of load control units 110 are communicably connected to each other by the above-mentioned communication line L101.

A connector 104 is attached to an end of the wire harness 103 described above. The connector 104 is constituted by terminal fittings attached to the ends of the communication line L101, the ground line L102 and the power source line L103, and a housing accommodating these terminal fittings (none of which are shown). Not only a connector attached to an electric junction box mounted on the vehicle, an end of another wire harness, or the like, but also the writing device 120 can be detachably connected to the connector 104.

As shown in FIG. 16, the plurality of load control units 110 include a power source terminal T101, an input/output terminal T102, a plurality of output terminals T31 to T3$n$, a plurality of switches SW1 to SWn, a power source IC 111, and a microcomputer 112.

The power source terminal T101 is a terminal to which the power source line L103 is connected and to which power from a battery 105 is input. The input/output terminal T102 is a terminal to which the communication line L101 is connected and through which a communication signal is input or output. The plurality of output terminals T31 to T3$n$ are terminals connected to the load 102 and through which power is output. The above-described power source terminal T101 and the plurality of output terminals T31 to T3$n$ are connected by a power source line L104. On the output terminal T31 to T3$n$ side, the power source line L104 are branched into a plurality of branch lines L1041 to L104$n$, which are connected to the plurality of output terminals T31 to T3$n$, respectively. As a result, the power input from the power source terminal T101 is distributed so as to be output from the plurality of output terminals T31 to T3$n$.

The plurality of switches SW1 to SWn are provided corresponding to the output terminals T31 to T3$n$, respectively, and are provided on the branch lines L1041 to L104$n$ branched from the power source line L104, respectively. When the switches SW1 to SWn are turned on, power is output from the corresponding output terminals T31 to T3$n$, and is supplied to the load 102. When the switches SW1 to SWn are turned off, the power supply from the corresponding output terminals T31 to T3$n$ is interrupted, and power supply to the load 102 is cut off.

Each of the switches SW1 to SWn is provided with a current detection function for detecting a current flowing through the switches SW1 to SWn themselves, and outputs the detected current value to the microcomputer 112. The total value of the currents flowing through the switches SW1 to SWn is the current flowing in the load control unit 110.

The power source IC 111 converts the power supply input from the power source terminal T101 to the operation power supply for the microcomputer 112 and outputs the operation power supply to the microcomputer 112. The microcomputer 112 has an operating section 112A, a voltage detecting section 112B, an input/output section 112C, a receiving section 112D, a storage section 112E, and an output section 112F.

The operating section 112A is constituted by a central processing unit (CPU), and controls the entire load control unit 110. The voltage detecting section 112B detects a voltage to be applied to the load control unit 110. The input/output section 112C inputs and outputs signals transmitted and received via the communication line L101.

The receiving section 112D is connected to the plurality of switches SW1 to SWn respectively, and receives the current value detected by the switches SW1 to SWn, thereby outputting the current value to the operating section 112A. The storage section 112E stores a program to be executed by the operating section 112A, and is a memory in which writing/rewriting of the programs are possible. The output section 112F is connected to the operating section 112A, and outputs on/off signals of the plurality of switches SW1 to SWn.

The above-described operating section 112A transmits the current value detected by the switches SW1 to SWn and the voltage value detected by the voltage detecting section 112B to the writing device 120.

The writing device 120 is configured to include a CPU provided with a memory such as a RAM and a ROM, for example. Upon receiving the current value and the voltage value from the load control unit 110, the writing device 120 calculates the power consumption, selects a program corresponding to the power consumption, and writes the program in the load control unit 110. The writing device 120 selects a program with reference to the table shown in FIG. 25 stored in the ROM, for example.

The "all switches off" shown in FIG. 25 is a program for the always-off control for all the switches SW1 to SWn. This all switches off is a program necessary for the load control unit 110 connected with no load 102 (that is, the power consumption is 0). In addition, the all switches off is a program which is not necessary for the load control unit 110 connected with the load 102 (that is, the power consumption is larger than 0).

The "on/off of switch" is a program for controlling on/off of the switches SW1 to SWn. The on/off of switch is a program necessary for the load control unit 110, which is connected to the load 102 and which requires on/off control of the switches SW1 to SWn. The on/off of switch is a program which is not necessary for the load control unit 110, which is not connected with any load 102 and does not require on/off control of the switches SW1 to SWn.

Incidentally, the allowable current that can pass through the load control unit 110 is determined by the capacities of the switches SW1 to SWn, the thickness of the power source line L103 connected to the load control unit 110, and the like. The power saving controls A, B, . . . shown in FIG. 25 are programs for controlling so that no current higher than the allowable current flows in the load control unit 110. For example, the program is one for performing control such as decreasing the duty ratio when the current is likely to exceed the allowable current in the case of driving the load 102 by the PWM method.

For this reason, the power saving controls A, B, . . . are necessary programs for the load control unit 110 connected with the load 102 consuming high power (for example, the load 102 whose power consumption is the threshold value or more). Further, the power saving controls A, B, are programs which are not necessary for the load control unit 110 connected with the load 102 consuming low power (for example, the load 102 whose power consumption is less than the threshold value).

In addition, the power saving controls A, B, . . . are, for example, programs having different parameters. These parameters are determined according to the power consumption of the load control unit 110.

Figure 17:
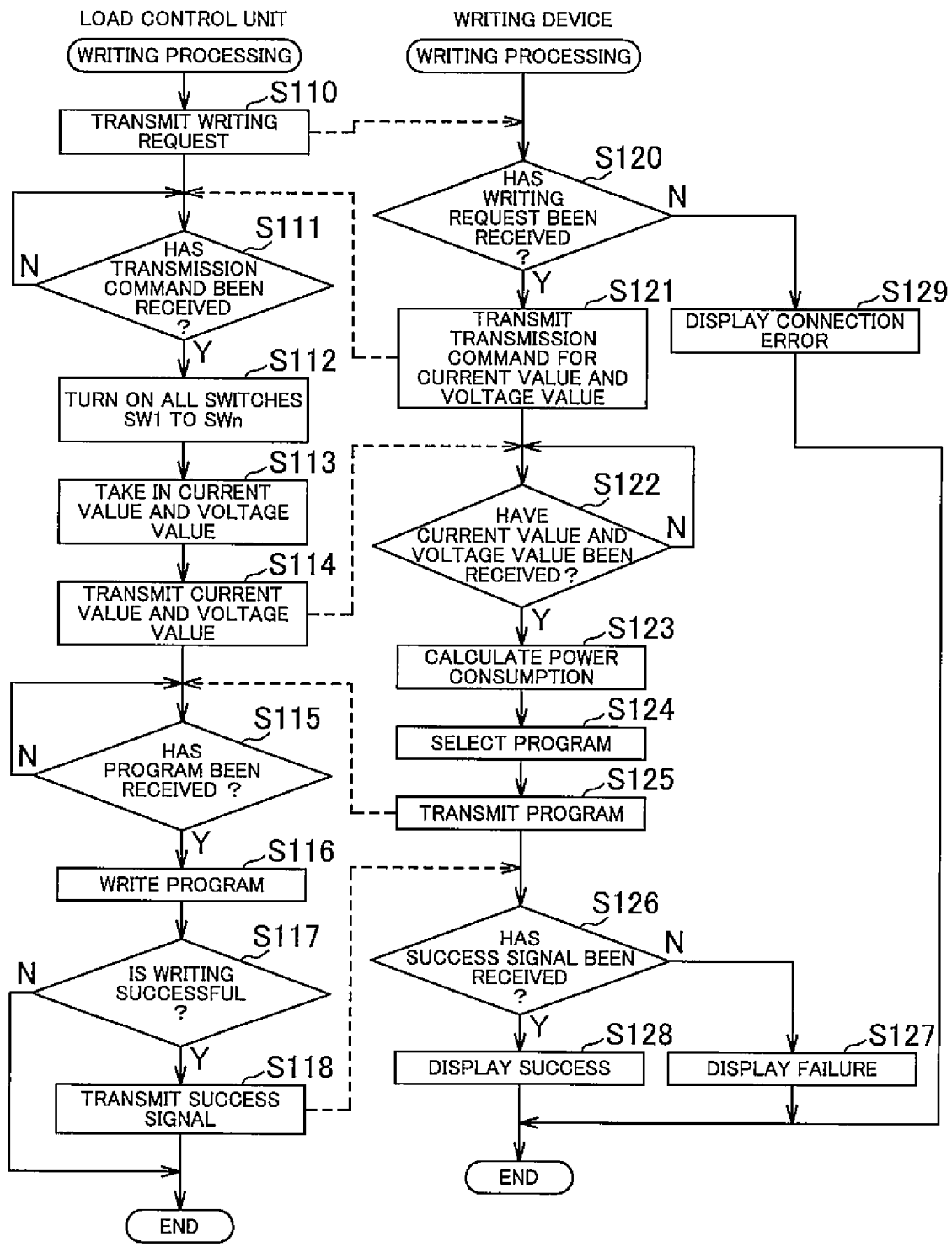
FIG. 17 is a flowchart showing a processing procedure of the load control unit and the writing device shown in FIG. 14.

Next, the operation of the writing system 100 having the above-described configuration will be described with reference to the flowchart of FIG. 17. Writing of the program in the present embodiment may be performed before mounting of the load control unit 110 in the vehicle or may be performed after the mounting. Before mounting the unit on the vehicle, the user connects the dummy load 102 to the output terminals T31 to T3n of the load control unit 110. The dummy load 102 is the same as the load 102 mounted on the vehicle. After the mounting of the unit on the vehicle, the actual load 102 mounted on the vehicle is already connected to the output terminals T31 to T3n of the load control unit 110.

Next, the user connects the writing device 120 to the connector 104 of the wire harness 103. Due to this, power is supplied from the battery 105 of the writing device 120 to each load control unit 110. When the writing device 120 and the plurality of load control units 110 are connected, the writing device 120 and the load control unit 110 start the writing processing shown in FIG. 17.

First, each load control unit 110 transmits a writing request in the writing processing (step S110). When the writing request from the load control unit 110 cannot be received within a predetermined time T11 after executing the writing processing (N in step S120), the writing device 120 displays a connection error (step S129) and ends the writing processing.

On the other hand, upon receiving a writing request from each load control unit 110 within the predetermined time T11 (Y in step S120), the writing device 120 transmits a command for transmission of a current value and a voltage value to each load control unit 110 (step S121).

Upon receiving the transmission command (Y in step S111), the load control unit 110 turns on all the switches SW1 to SWn (step S112) and supplies power to all the loads 102 connected to the output terminals T31 to T3n. Thereafter, the load control unit 110 takes in the current value detected by each of the switches SW1 to SWn and also takes in the voltage value detected by the voltage detecting section 112B (step S113). Next, the load control unit 110 transmits the captured current value and voltage value to the writing device 120 (step S114).

Upon receiving the current value and the voltage value from the load control unit 110 by functioning as a receiving section (Y in step S122), the writing device 120 adds the current values of the switches SW1 to SWn thereto to obtain the value of the current that flows in the load control unit 110. Thereafter, the writing device 120 calculates the power consumption by multiplying the obtained current value and the received voltage value together (step S123). Then, the writing device 120 selects a program corresponding to the magnitude of the power consumption with reference to FIG. 25 (step S124).

Next, the writing device 120 functions as a writing unit and transmits the program selected in step S124 to the load control unit 110 (step S125). Upon receiving a program from the writing device 120 (Y in step S115), the load control unit 110 writes the received program (step S116). When the writing is successful (Y in step S117), the load control unit 110 transmits a success signal indicating the success (step S118), and terminates the processing. When the writing fails (N in step S117), the load control unit 110 immediately terminates the processing.

When the writing device 120 cannot receive the success signal within a predetermined time T12 after transmitting the program (N in step S126), the writing device 120 displays the failure (step S127) and ends the processing. On the other hand, when the writing device 120 receives the success signal within the predetermined time T12 after transmitting the program (Y in step S126), the writing device 120 displays success of the writing (step S128) and ends the processing.

According to the embodiment described above, the writing device 120 selects a program corresponding to the power consumption of the load control unit 110 among a plurality of programs, and writes the selected program in the load control unit 110. Due to this, no work for setting the identification number to the load control unit 110 in advance is required, so that the program can be easily selected.

According to the above-described embodiment, not all of the plurality of programs, but only the program selected by the writing device 120 is recorded in the load control unit 110. Therefore, the writing operation can be shortened and the capacity of the storage section 112E can be saved.

Further, according to the above-described embodiment, the plurality of load control units 110 are connected to the wire harness 103 to which the connector 104 is attached at one end thereof, and the writing device 120 is connected to the connector 104. As a result, the program can be written in the load control unit 110 in a state in which the plurality of load control units 110 are attached to the wire harness 103. Thus, programs can be easily written in the plurality of load control units 110.

According to the embodiment described above, the execution unit is composed of the writing device 120, which selects the program according to the power consumption for writing, but the present invention is not limited thereto. As in the conventional example, it is conceivable to write all the programs in the load control unit 110 so as to validate and execute only the program selected according to the power consumption. In this case, the load control unit 110 functions as a load control unit and an execution unit.

Further, according to the above-described embodiment, power consumption is used as a value corresponding to the current value, but the manner is not limited thereto. A program corresponding to the current value may be selected by detecting only the current value.

Further, according to the above-described embodiment, the load control unit 110 performs writing by the writing device 120 in a state of being attached to the wire harness 103, but the manner is not limited thereto. The writing may be performed by connecting the writing device 120 and the power supply to the load control unit 110 before the attachment of the wire harness 103.

Further, according to the above-described embodiment, the load control unit 110 transmits each current value detected by the switches SW1 to SWn and the voltage value detected by the voltage detecting section 112B, and the writing device 120 adds up each current values and obtains the power consumption by multiplying the value by the voltage value, but the manner is not limited thereto. The load control unit 110 may add up respective current values detected by the switches SW1 to SWn to transmit the added current value to the writing device 120. Further, the load control unit 110 adds up respective current values detected by the switches SW1 to SWn, and may multiply the value by the voltage value detected by the voltage detecting section 112B to obtain power consumption, thereby transmitting the obtained power consumption to the writing device 120.

Third Embodiment

Figure 18:
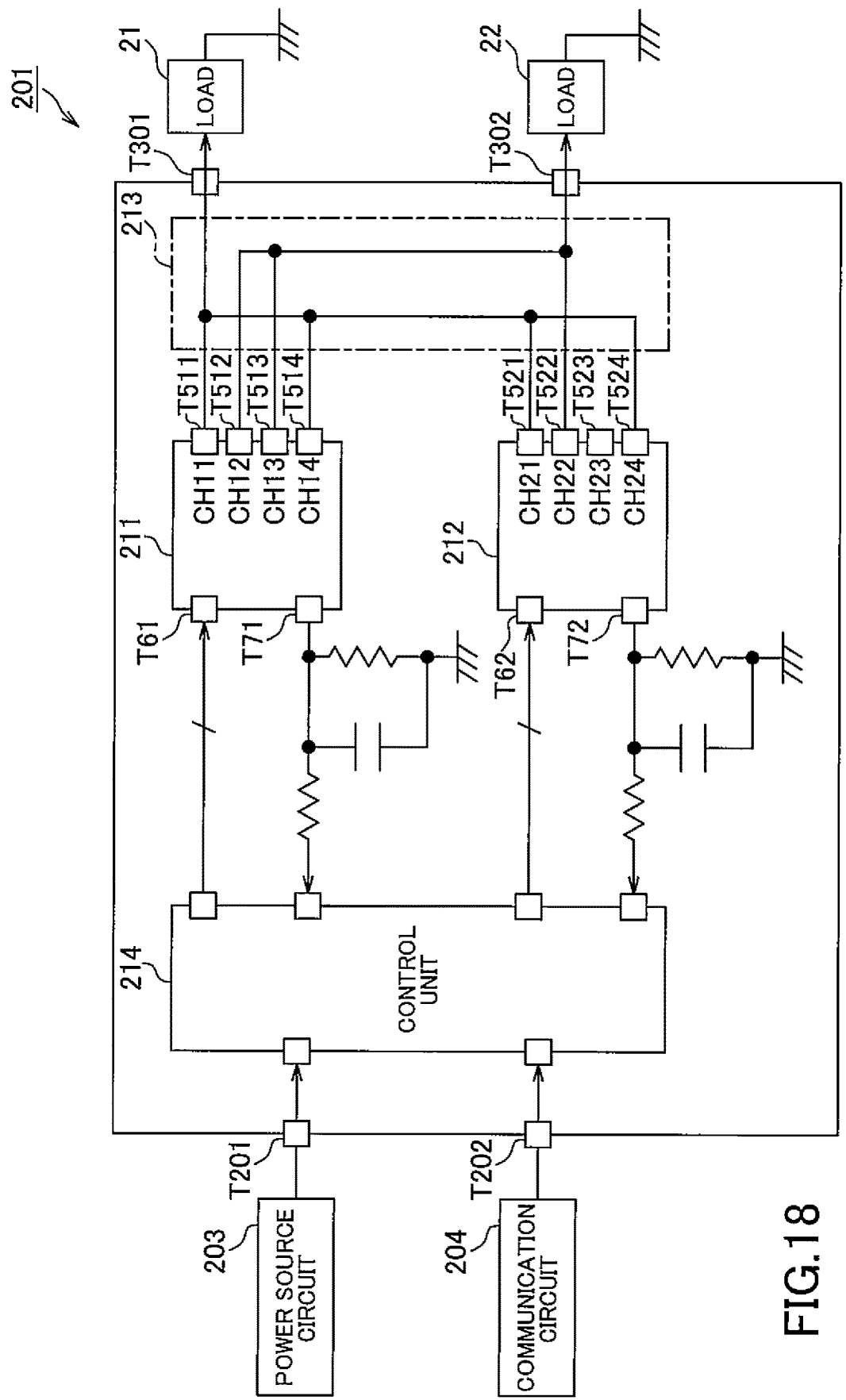
FIG. 18 is a diagram showing an embodiment of a load controller of the present invention.

Hereinafter, an embodiment of the present invention will be described with reference to FIGS. 18 to 20. FIG. 18 is a diagram showing one embodiment of the load controller of the present invention. A load controller 201 of the present invention is a device that controls power supply to loads 21 and 22 such as lamps mounted in a vehicle, namely a passenger car for example.

As shown in FIG. 18, the load controller 201 includes a power source terminal T201, a communication terminal T202, and a plurality of output terminals T301 and T302 constituted by terminal fittings. Further, the load controller 201 includes a plurality of intelligent power devices (IPDs) 211 and 212, a switching section 213, and a control unit 214.

The power source terminal T201 is a terminal to which the power source circuit 203 is connected and to which power is supplied. The communication terminal T202 is a terminal to which the communication circuit 204 is connected for input and output of a communication signal. The plurality of output terminals T301 and T302 are connected to the loads 21 and 22, respectively for outputting power.

Figure 19:
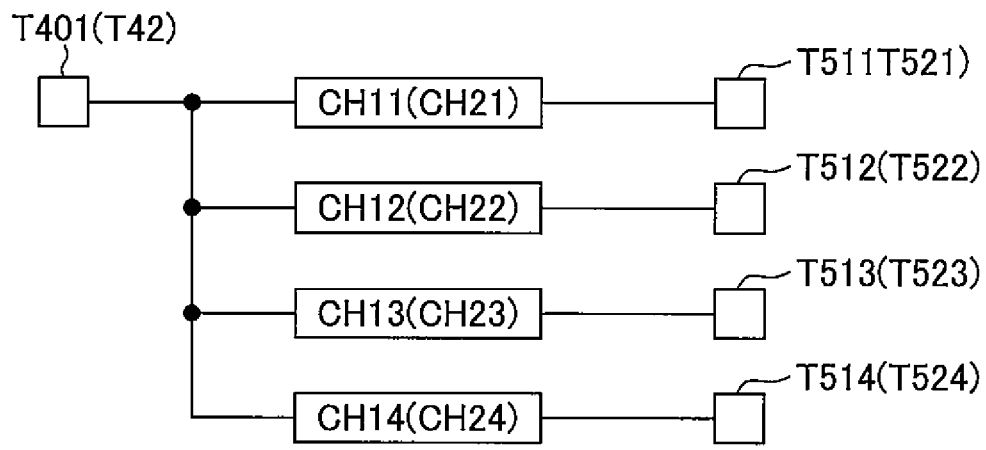
FIG. 19 is a diagram showing details of an IPD shown in FIG. 18.
Figure 20:
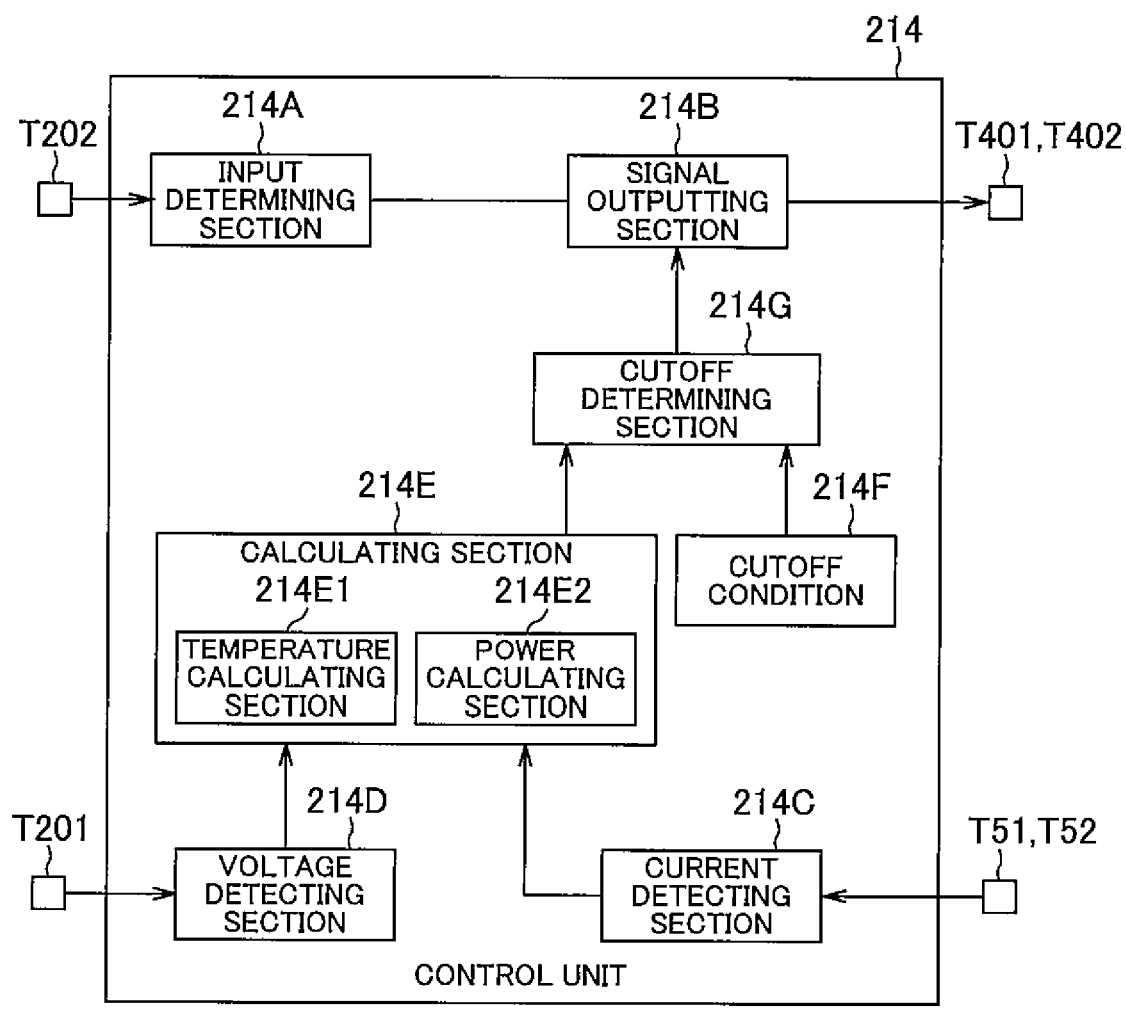
FIG. 20 is a functional block diagram of a control unit shown in FIG. 18.

As shown in FIGS. 18 and 19, the IPDs 211 and 212 have power source terminals T401 and T402 (see FIG. 19), a plurality of semiconductor relays CH11 to CH14, CH21 to CH24 (hereinafter also simply referred to as "semiconductor relays CH"), and a plurality of relay terminals T511 to T514, T521 to T524, input terminals T61 and T62, and sense terminals T71 and T72. The power source terminals T401 and T402 are terminals to which the power supplied from the power source terminal T201 is distributed and input. The power supplied from the power source terminals T401 and T402 is distributed to the plurality of semiconductor relays CH.

In the present embodiment, an example in which the two IPDs 211 and 212 are built in the load controller 201, and four semiconductor relays CH are built in each one of the IPDs 211 and 212, that is, eight semiconductor relays CH are incorporated in the load controller 201 will be described, but the present invention is not limited to this. The number of the semiconductor relays may be two or more.

Each semiconductor relay CH has a function as a current detection unit. The semiconductor relay CH detects the current flowing through itself and outputs the detected current data to the control unit 214. The sense terminals T71 and T72 are terminals for outputting the current data respectively detected by the respective semiconductor relays CH.

The switching section 213 is provided between the IPDs 211 and 212 and the output terminals T301 and T302. The switching section 213 is composed of switches (not shown), and the connecting destinations of a plurality of semiconductor relays CH can be arbitrarily selected for switching from the output terminals T301 and T302.

Control of the switching section 213 is performed by the control unit 214. The control unit 219 adjusts the number of switches connected to the same loads 21 and 22 and connected in parallel to each other so that the current flowing through each of the semiconductor relays CH does not exceed a threshold value when the loads 21 and 22 are changed.

FIG. 18 shows an example in which the semiconductor relays CH11 and CH19 of the IPD 211 and the semiconductor relays CH21 and CH24 of the IPD 212 are connected to the output terminal T301 by the control unit 219. Because of this, when the semiconductor relays CH11, CH14, CH21, and CH24 are turned on, power is output from the output terminal T301 and is supplied to the load 21 connected to the output terminal T301. When the semiconductor relays CH11, CH14, CH21, and CH24 are turned off, the power supply from the output terminal T301 is cut off, and the power supply to the load 21 connected to the output terminal T301 is cut off. These semiconductor relays CH11 and CH14 of the IPD211 and the semiconductor relays CH21 and CH24 of the IPD212 are a plurality of parallel semiconductor relays (parallel switches) connected to the same load 21 and connected in parallel with each other.

In addition, the semiconductor relays CH12 and CH13 of the IPD211 and the semiconductor relay CH22 of the IPD212 are connected to the output terminal T302 by the control unit 214 in FIG. 18. As a result, when the semiconductor relays CH12, CH13, and CH22 are turned on, power is output from the output terminal T302 and is supplied to the load 22 connected to the output terminal T302. When the semiconductor relays CH12, CH13, and CH22 are turned off, the power supply from the output terminal T302 is cut off, and the power supply to the load 22 connected to the output terminal T302 is cut off. The semiconductor relays CH12 and CH13 of the IPD211 and the semiconductor relay CH22 of the IPD212 are a plurality of parallel semiconductor relays connected to the same load 22 and connected in parallel with each other.

The control unit 214 is constituted by a microcomputer including a central processing unit (CPU) provided with a memory such as a random access memory (RAM) and a read only memory (ROM), and controls the entire load controller 201.

The control unit 214 is supplied with power from the power source terminal T201. The control unit 214 is connected to the communication terminal T202, and inputs and outputs a communication signal. Further, the control unit 214 is connected to the input terminals T61 and T62 of the IPD, and outputs signals for turning on and off the respective semiconductor relays CH to control power supply to the loads 21 and 22. Further, the control unit 219 is connected to the sense terminals T71 and T72 of the IPDs 211 and 212. As a result, current data detected by each semiconductor relay CH is input to the control unit 214.

Next, the detailed configuration of the above-described control unit 219 will be described with reference to FIG. 20. The control unit 214 includes an input determining section 214A and a signal output section 214B. The input determining section 214A determines on/off of the semiconductor relay CH based on communication with the master ECU. The signal output section 214B outputs a signal for turning on and off the semiconductor relay CH, according to the determination of the input determining section 214A.

Further, the control unit 214 includes a current detecting section 2140, voltage detecting section 214D, calculating section 214E, cutoff condition 214F, and cutoff determining section 214G. The current detecting section 214C takes in the current data input from the sense terminals T71 and T72 of the IPDs 211 and 212. The voltage detecting section 214D detects the power source voltage input from the power source terminal T201. The calculating section 214E includes a temperature calculating section 214E1 and a power calculating section 214E2. The temperature calculating section 214E1 calculates the temperature of each semiconductor relay CH from the detected current taken in by the current detecting section 214C. As a calculation of the temperature, for example, a known technique as described in JP 2009-130944 A may be used.

The power calculating section 214E2 multiplies the power source voltage value detected by the voltage detecting section 214D and the detected current value taken in by the current detecting section 214C together to calculate the power in each semiconductor relay CH. The cutoff condition 214F stores a cutoff setting temperature, cutoff setting power, and cutoff setting current (threshold value) of the temperature, power, and current respectively. The cutoff determining section 214G determines whether the temperature data, power data, and current data of each of the semiconductor relays CH calculated by the calculating section 214E are equal to or greater than the cutoff setting temperature, cutoff setting power, and cutoff setting current respectively. If any one of the temperature data, power data, and current data is equal to or greater than the cutoff setting temperature, cutoff setting power, or cutoff setting current, the cutoff determining section 214G cuts off the semiconductor relay CH. Further, the cutoff determining section 214G further cuts off the semiconductor relay CH connected to the same loads 21 and 22 as the semiconductor relay CH to be cut off and connected in parallel.

For example, when any one of the temperature data, power data, and current data of the semiconductor relay CH11 exceeds the cutoff setting temperature, cutoff setting power, or cutoff setting current, the cutoff determining section 214G determines to cut off (turn off) the semiconductor relay CH11 that exhibits a value equal to or greater than the cutoff setting temperature, cutoff setting power, or cutoff setting current. The cutoff determining section 214G further cuts off the semiconductor relays CH14, CH21, and CH24 connected to the same load 21 as the semiconductor relay CH11 to be cut off and connected in parallel. The signal output section 214B outputs an off-signal according to the determination result from the cutoff determining section 214G.

Next, the operation of the load controller 201 outlined above will be described below with reference to the flowchart of FIG. 21. The control unit 214 functions as the input determining section 214A and the signal output section 219B and performs a control processing of outputting a signal for turning on and off the semiconductor relay CH in accordance with communication with the master ECU.

Figure 21:
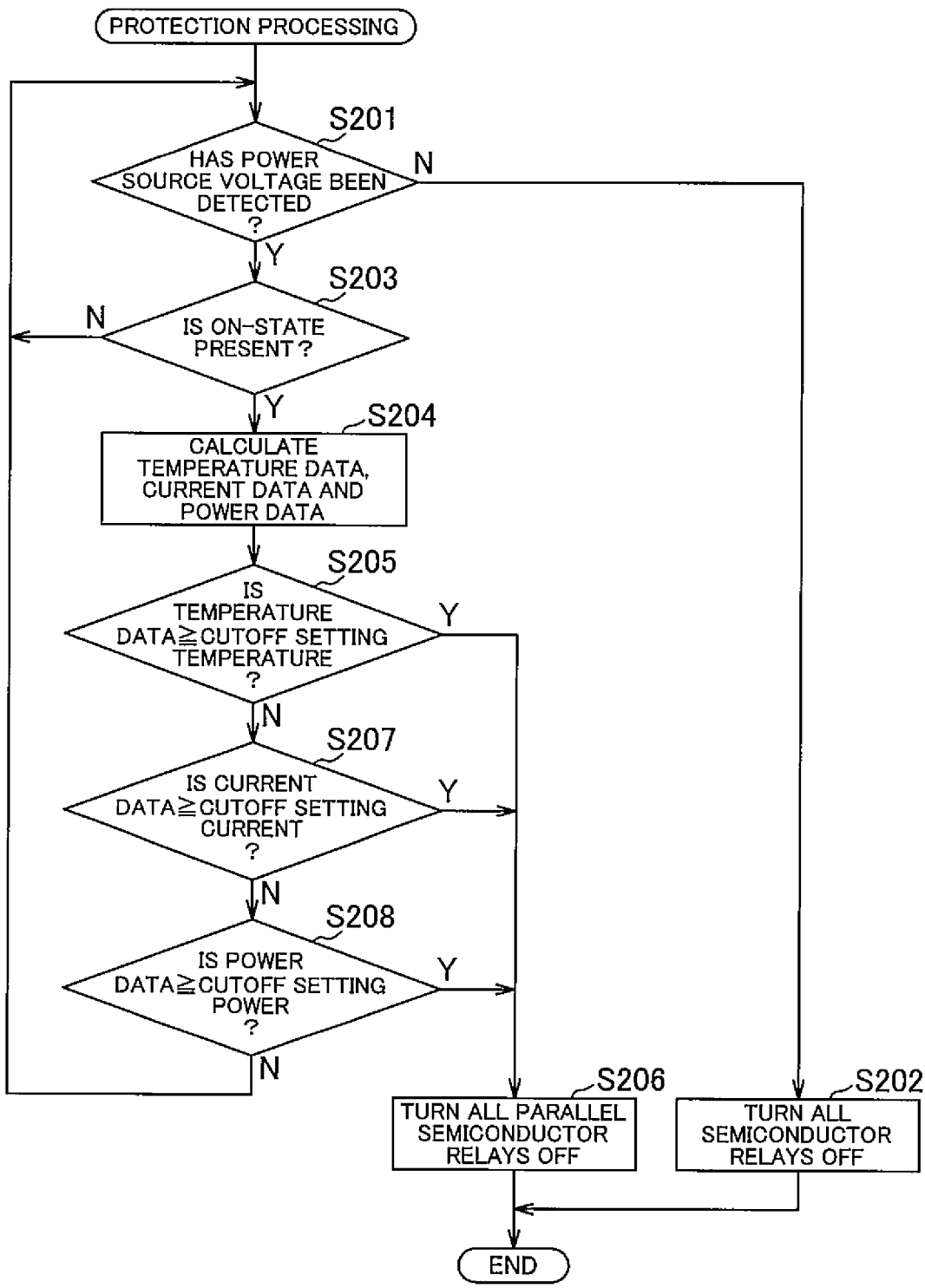
FIG. 21 is a flowchart showing a protection processing procedure of the control unit shown in FIG. 18.

The control unit 219 performs the protection processing shown in FIG. 21 in parallel with the control processing. The control unit 214 determines whether the power source voltage has been detected within a predetermined time (step S201). When the power source voltage is not detected (N in step S201), the control unit 214 turns off all of the semiconductor relays CH of the IPDs 211 and 212 (step S202) and ends the processing. When turning off, the control unit 214 starts the processing of detecting the power source voltage, and starts the flowchart shown in FIG. 21 again when the detection of the power source voltage ends.

On the other hand, if the power source voltage has been detected within a predetermined time (Y in step S201), the control unit 214 determines whether a semiconductor relay CH in the on-state is present (step S203). When no semiconductor relay CH in the on-state is present (N in step S203), the control unit 214 returns to step S201 again.

When a semiconductor relay CH in the on-state is present (Y in step S203), the control unit 214 captures the current data of each semiconductor relay CH. In addition, the control unit 214 calculates the temperature data and the power data of the semiconductor relay CH as, described above (step S204). Next, when the calculated temperature data is equal to or higher than the cutoff setting temperature (Y in step S205), the control unit 214 simultaneously turns off all of the plurality of parallel semiconductor relays CH including the semiconductor relay CH exhibiting a temperature equal to or higher than the cutoff setting temperature (step S206), and terminates the processing.

On the other hand, if the calculated temperature data is lower than the cutoff setting temperature (N in step S205), the control unit 214 determines whether the current data is equal to or greater than the cutoff setting current (step S207). When the current data is equal to or greater than the cutoff setting current (Y in step S207), the control unit 214 simultaneously turns off all of the plurality of parallel semiconductor relays CH including the semiconductor relay CH exhibiting a current equal to or greater than the cutoff setting current (step S206), and terminates the processing.

On the other hand, when the calculated current data is less than the cutoff setting current (N in step S207), the control unit 214 determines whether the power data is equal to or higher than the cutoff setting power (step S208). when the power data is equal to or higher than the cutoff setting power (Y in step S208), the control unit 214 simultaneously turns off all of the plurality of parallel semiconductor relays CH including the semiconductor relay CH exhibiting power equal to or greater than the cutoff setting power (step S206), and terminates the processing.

On the other hand, when the calculated power data is less than the cutoff setting power (N in step S208), the control unit 214 returns to step S201 again.

According to the above-described embodiment, when an abnormality is detected in any one of the plurality of parallel semiconductor relays CH, all the parallel semiconductor relays CH are turned off, so that abnormal heat generation and deterioration in resistance can be suppressed. Detailed description will be made with reference to FIGS. 22 and 23. For example, in a former art of turning off only the semiconductor relay CH in which an abnormality has been detected out of the plurality of parallel semiconductor relays CH11, CH14, CH21, and CH24, the change in heat quantity is as shown in FIG. 22.

Figure 22:
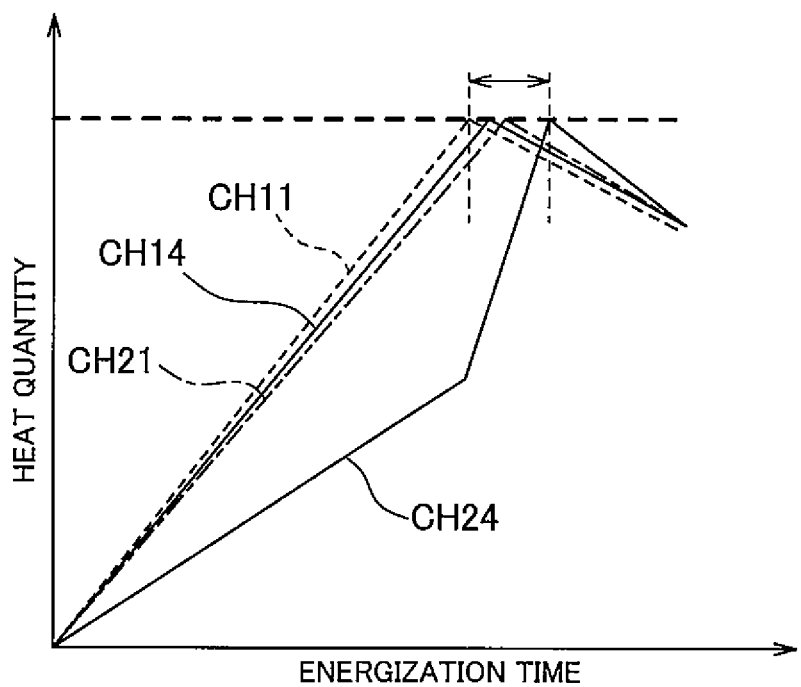
FIG. 22 is a time chart of the heat quantity of each of the semiconductor relays connected in parallel in the conventional example.

In the example shown in FIG. 22, the current flowing through the semiconductor relay CH 24 is smaller than the currents flowing through the semiconductor relays CH11, CH14, and CH21 due to the difference in on-resistance or the like. Therefore, when the semiconductor relays CH are turned off in the order of arrival of their values at values equal to or higher than the cutoff setting temperature, cutoff setting power, or cutoff setting current, the semiconductor relays CH11, CH14, and CH21 are turned off first and the semiconductor relay CH24 is turned off belatedly. When the semiconductor relays CH11, CH14, and CH21 are turned off first, the current headed for the semiconductor relays CH11, CH14, and CH21 till then allowed to flow to the semiconductor relay CH24, so that the current suddenly rises.

Figure 23:
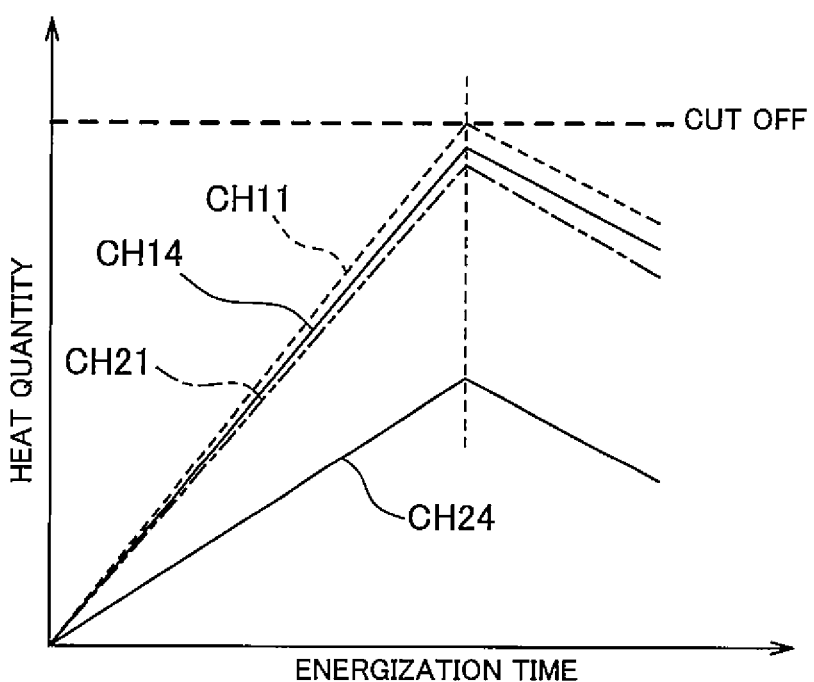
FIG. 23 is a time chart of the heat quantity of each of the parallel-connected semiconductor relays in the present embodiment shown in FIG. 18.

On the other hand, in the present embodiment in which all the parallel semiconductor relays CH are turned off when an abnormality is detected in any one of the plurality of parallel semiconductor relays CH, the change in the heat quantity is as shown in FIG. 23.

In the example shown in FIG. 23, the current flowing through the semiconductor relay CH 24 is smaller than the currents flowing through the semiconductor relays CH11, CH14, and CH21 due to the difference in on-resistance or the like similarly to FIG. 22. However, if an abnormality is detected in any one of the semiconductor relays CH11, CH14, CH21, and CH24, all the semiconductor relays CH11, CH14, CH21, and CH24 are simultaneously turned off. As a result, there is no risk of current flow concentrating on one semiconductor relay CH, so abnormal heat generation and resistance deterioration can be suppressed.

Further, according to the above embodiment, the control unit 214 detects an abnormality if any one of the temperature, current, and power is equal to or higher than the cutoff setting temperature, cutoff setting current, or cutoff setting power. In particular, by detecting an abnormality based on electric power, abnormality of power source voltage can also be dealt with. Therefore, abnormal heat generation and deterioration in resistance can be further suppressed.

Further, the control program executed by the control unit 214 described above can perform rewriting and writing by using a writing device 205 as shown in FIG. 24. When a need to change the loads 21 and 22 and to rewrite the control program arises, the writing device writes only the portion requiring rewriting, such as the cutoff setting temperature, cutoff setting current, and cutoff setting power, among the control programs.

According to the above-described embodiment, an abnormality is detected if any one of the temperature, current, and electric power is equal to or higher than the cutoff setting temperature, cutoff setting current, or cutoff setting power, but, the manner of abnormality detection is not limited thereto. As in the conventional example, an abnormality may be detected when any one of the temperature and the current exceeds the cutoff setting temperature or the cutoff setting current.

Further, according to the above-described embodiment, the switching section 213 is provided so that the connection between the semiconductor, relay CH and the output terminals T301 and 1302 can be switched, but the manner is not limited thereto. The switching section 213 is not essential. The present embodiment may be applied to the load controller 201 having parallel switches connected to the same loads 21 and 22 and connected in parallel, and for example, the semiconductor relays CH and the output terminals T301 and T302 may be connected in advance, as shown in FIG. 18.

Further, according to the above embodiment, when an abnormality is detected in any one of the semiconductor relays CH11, CH14, CH21, and CH24, only the semiconductor relays CH11, CH14, CH21, and CH24 are turned off, and the semiconductor relays CH12, CH13 and CH22 are not turned off, but the situation is not limited to this. The present invention is not limited as long as at least the semiconductor relays CH11, CH14, CH21, and CH24 are turned off when an abnormality is detected in any one of the semiconductor relays CH11, CH14, CH21, and CH24, and all of the semiconductor relays CH11 to CH14 and CH21 to CH24 provided in the load controller 201 may be turned off.

It should be noted that the present invention is not limited to the above embodiments. That is, various modifications can be made without departing from the gist of the present invention.

REFERENCE SIGNS LIST 1 load controller
11 switching unit (switching section)
14 microcomputer (first adjustment unit, second adjustment unit)
31, 32 load
B threshold value
C threshold value
CH1 to CH4 semiconductor relay (switch, current detection unit)
T41 to T44 output terminal
100 writing system (control system)
102 load
103 wire harness
104 connector
110 load control unit
120 writing device (executing unit, receiving unit, writing unit)
21, 22 load
214 control unit (abnormality detection unit, control unit)
CH11, CH14, CH21, CH24 semiconductor relay (parallel switch)
CH12, CH13, CH22 semiconductor relay (parallel switch)

What is claimed is:

1. A load controller comprising:
a plurality of switches provided between a power source and a plurality of loads;
a plurality of current detection units configured to detect a current flowing through each of the plurality of switches, each of the plurality of current detection units being included in each of the plurality of switches; and
a first adjustment unit configured to increase a total number of the switches connected in series to a same load and connected in parallel to each other, when one of currents detected by the plurality of current detection units exceeds a threshold value.

2. The load controller according to claim 1, further comprising:
a plurality of output terminals to which separate loads are respectively connected; and
a switching section configured to switch by arbitrarily selecting a connecting destination of each of the plurality of switches from among the plurality of output terminals, wherein
the first adjustment unit controls the switching section to adjust the number of the switches.

3. The load controller according to claim 2, further comprising:
a PWM control unit configured to start a PWM control of the plurality of switches when the current flowing through each of the plurality of switches or sum of currents flowing through the plurality of switches exceeds a threshold value.

4. The load controller according to claim 3, wherein
the PWM control unit outputs pulses having a same duty to the plurality of parallel-connected switches connected in series to the same load and connected in parallel to each other among the plurality of switches to control on/off of the plurality of parallel-connected switches, and
the load controller further comprises a second adjustment unit configured to shift a phase of the pulses to be output to the plurality of parallel-connected switches such that the currents are constant when the plurality of parallel-connected switches are on.

5. The load controller according to claim 2, further comprising:
a PWM control unit configured to output pulses having a same duty to the plurality of parallel-connected switches connected in series to the same load and connected in parallel to each other among the plurality of switches so as to control on/off of the plurality of parallel-connected switches; and
a second adjustment unit configured to shift a phase of the pulses to be output to the plurality of parallel-connected switches such that the currents are constant when the plurality of parallel-connected switches are on.

6. The load controller according to claim 1, further comprising:
a PWM control unit configured to start a PWM control of the plurality of switches when the current flowing through each of the plurality of switches or sum of currents flowing through the plurality of switches exceeds a threshold value.

7. The load controller according to claim 6, wherein
the PWM control unit outputs pulses having a same duty to the plurality of parallel-connected switches connected in series to the same load and connected in parallel to each other among the plurality of switches to control on/off of the plurality of parallel-connected switches, and
the load controller further comprises a second adjustment unit configured to shift a phase of the pulses to be output to the plurality of parallel-connected switches such that the currents are constant when the plurality of parallel-connected switches are on.

8. The load controller according to claim 1, further comprising:
a second adjustment unit configured to deviate a phase of an on/off signal output to the plurality of switches that are connected in parallel, such that the plurality of switches are configured to be turned on/off simultaneously.

9. A load controller comprising:
a plurality of switches provided between a power source and a load;
a current detection unit configured to detect a current flowing through each of the plurality of switches;
a first adjustment unit configured to adjust a number of the plurality of switches connected in series to a same load and connected in parallel to each other, based on a detection result of the current detection unit;
a PWM control unit configured to output pulses having a same duty to the plurality of parallel-connected switches connected in series to the same load and connected in parallel to each other among the plurality of switches so as to control on/off of the plurality of parallel-connected switches; and
a second adjustment unit configured to shift a phase of the pulses to be output to the plurality of parallel-connected switches such that the currents are constant when the plurality of parallel-connected switches are on.

10. A method for controlling a load, the method comprising:
step of detecting a current flowing through each of a plurality of switches provided between a power source and a plurality of loads; and
step of increasing a total number of the switches connected in series to a same load and connected in parallel to each other when one of currents detected in the step of detecting exceeds a threshold value.

11. The method for controlling a load according to claim 10, further comprising:
step of deviating a phase of an on/off signal output to the plurality of switches that are connected in parallel, such that the plurality of switches are configured to be turned on/off simultaneously.

* * * * *